(12) United States Patent
Nallathambi et al.

(10) Patent No.: US 10,608,660 B2
(45) Date of Patent: Mar. 31, 2020

(54) PULSED BASED ARITHMETIC UNITS

(71) Applicant: University of Florida Research Foundation, Inc., Gainesville, FL (US)

(72) Inventors: Gabriel Nallathambi, San Jose, CA (US); Jose C. Principe, Gainesville, FL (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 80 days.

(21) Appl. No.: 15/754,642

(22) PCT Filed: Aug. 24, 2016

(86) PCT No.: PCT/US2016/048326
§ 371 (c)(1),
(2) Date: Feb. 23, 2018

(87) PCT Pub. No.: WO2017/035197
PCT Pub. Date: Mar. 2, 2017

(65) Prior Publication Data
US 2018/0269894 A1 Sep. 20, 2018

Related U.S. Application Data

(60) Provisional application No. 62/209,687, filed on Aug. 25, 2015.

(51) Int. Cl.
*G06F 7/68* (2006.01)
*H03M 1/60* (2006.01)
(Continued)

(52) U.S. Cl.
CPC .............. *H03M 1/60* (2013.01); *G06F 7/605* (2013.01); *G06F 7/68* (2013.01); *H03M 1/56* (2013.01)

(58) Field of Classification Search
CPC ............ H03M 1/60; G06F 7/605; G06F 7/68
(Continued)

(56) References Cited

U.S. PATENT DOCUMENTS 5,157,621 A * 10/1992 Ishimoto ................ G01D 5/244
708/102
7,324,035 B2 1/2008 Harris et al.
(Continued)

OTHER PUBLICATIONS

International Search Report for PCT/US2016/048326 dated Nov. 3, 2016.
(Continued)

*Primary Examiner* — Tan V Mai
(74) *Attorney, Agent, or Firm* — Thomas | Horstemeyer LLP

(57) ABSTRACT

Various examples of devices, methods and systems related to pulse based arithmetic units. In one example, a pulse domain device includes an augend area calculator to provide an augend area output for an augend pulse train; an addend area calculator to provide an addend area output for an addend pulse train; a resultant sum area (RSA) decoder to provide a RSA output using the augend and addend area outputs; and a pulse timing calculator to provide RSA output pulse timing. In another example, a pulse domain device includes a multiplicand area calculator to provide an multiplicand area output for a multiplicand pulse train; a multiplier area calculator to provide a multiplier area output for a multiplier pulse train; a resultant product area (RPA) decoder to provide a RPA output using the multiplicand and multiplier area outputs; and a pulse timing calculator to provide RPA output pulse timing.

24 Claims, 22 Drawing Sheets

(51) Int. Cl.
*G06F 7/60* (2006.01)
*H03M 1/56* (2006.01)

(58) Field of Classification Search
USPC .......................................................... 708/620
See application file for complete search history.

(56) References Cited

U.S. PATENT DOCUMENTS

| | | |
|---|---|---|
| 7,996,452 B1 | 8/2011 | Cruz-Albrecht et al. |
| 8,139,654 B2 | 3/2012 | Chen et al. |
| 2013/0113642 A1 | 5/2013 | McCune, Jr. |
| 2015/0141857 A1 | 5/2015 | Nallathambi et al. |

OTHER PUBLICATIONS

McCormick, "Digital Pulse Processing", Submitted to the Department of Electrical Engineering and Computer Science on Jul. 19, 2012, 74 pages.

\* cited by examiner

PULSED BASED ARITHMETIC UNITS

CROSS REFERENCE TO RELATED APPLICATIONS

This application is the 35 U.S.C. § 371 national stage application of PCT Application No. PCT/US2016/048326, filed Aug. 24, 2016, where the PCT claims priority to, and the benefit of, U.S. provisional application entitled "Pulsed Based Arithmetic Units" having Ser. No. 62/209,687, filed Aug. 25, 2015, both of which are herein incorporated by reference in their entireties.

BACKGROUND

Signal processors use analog to digital converters (ADCs) to represent a given signal using uniform sampling, which relies on a worst case condition or Nyquist criterion to represent a bandlimited signal. However, this type of sampling (also referred to as redundant sampling) is not efficient in applications where only specific regions are of interest.

SUMMARY

Embodiments of the present disclosure are related to pulse based arithmetic units.

In one embodiment, among others, a pulse domain device comprises an augend area calculator configured to provide an augend area output corresponding to an area of an augend pulse train input; an addend area calculator configured to provide an addend area output corresponding to an area of an addend pulse train input; a resultant sum area (RSA) decoder configured to provide a RSA output based upon the augend area output and the addend area output; and a pulse timing calculator configured to provide RSA output pulse timing corresponding to the RSA output. In one or more aspects of these embodiments, the pulse domain device can comprise a time-to-counts converter (TCC) configured to convert IF pulse timing of the augend pulse train input and the addend pulse train input into corresponding digital counts provided to the augend area calculator and the addend area calculator. The corresponding digital counts can comprise a high speed digital count and a low speed digital count. The high speed digital count can be based upon IF pulses of both the augend pulse train input and the addend pulse train input. The low speed digital count can be based upon IF pulses of either the augend pulse train input or the addend pulse train input. The pulse domain device can comprise output pulse train circuitry configured to generate an output pulse train based upon the RSA output and the RSA output pulse timing.

In another embodiment, a pulse domain device comprises a multiplicand area calculator configured to provide an multiplicand area output corresponding to an area of a multiplicand pulse train input; a multiplier area calculator configured to provide a multiplier area output corresponding to an area of a multiplier pulse train input; a resultant product area (RPA) decoder configured to provide a RPA output based upon the multiplicand area output and the multiplier area output; and a pulse timing calculator configured to provide RPA output pulse timing corresponding to the RPA output. In one or more aspects of these embodiments, the pulse domain device can comprise a time-to-counts converter (TCC) configured to convert IF pulse timing of the multiplicand pulse train input and the multiplier pulse train input into corresponding digital counts provided to the multiplicand area calculator and the multiplier area calculator.

In one or more aspects of these embodiments, the corresponding digital counts can comprise a high speed digital count and a low speed digital count. The high speed digital count can be based upon IF pulses of both the multiplicand pulse train input and the multiplier pulse train input. The low speed digital count can be based upon IF pulses of either the multiplicand pulse train input or the multiplier pulse train input. The pulse domain device can comprise output pulse train circuitry configured to generate an output pulse train based upon the RPA output and the RPA output pulse timing. The pulse domain device can comprise a pulse polarity calculator configured to provide an output pulse polarity output based upon pulse polarities of the multiplicand pulse train input and the multiplier pulse train input.

In another embodiment, a method comprises receiving a first pulse train corresponding to a first analog signal by a predefined constraint function and a second pulse train corresponding to a second analog signal by the predefined constraint function; and generating an output pulse train through a pulse domain operation on the first and second pulse trains. In one or more aspects of these embodiments, the first pulse train is an augend pulse train, the second pulse train is an addend pulse train, and the pulse domain operation is pulse domain addition of the augend and addend pulse trains. The pulse domain addition can comprise determining output pulses from a resultant sum area (RSA) based upon the augend and addend pulse trains; and determining corresponding output pulse times based at least in part upon RSA timing. The first pulse train can be a multiplicand pulse train, the second pulse train is a multiplier pulse train, and the pulse domain operation is pulse domain multiplication of the multiplicand and multiplier pulse trains.

In one or more aspects of these embodiments, the pulse domain multiplication can comprise determining output pulses from a resultant product area (RPA) based at least in part upon the augend and addend pulse trains; and determining corresponding output pulse times based at least in part upon RPA timing. The RPA can further be based upon a reference timing pulse train. The method can comprise reconstructing an analog output signal from the output pulse train. The first pulse train can correspond to an area under the first analog signal and the second pulse train corresponds to area under the second analog signal. The first and second pulse trains can be generated by independent integrate and fire analog-to-pulse converters (IFCs). The first and second analog signals can be finite bandwidth signals. The constraint function can preserve a one-to-one mapping with a unique inverse function.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
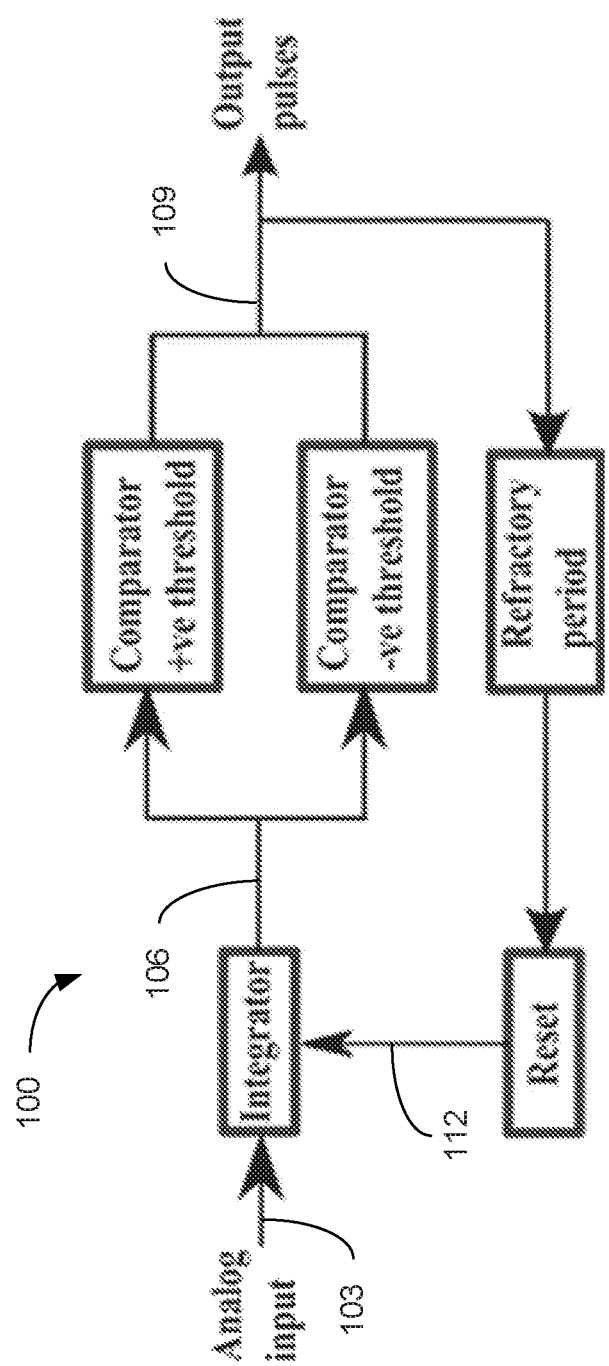
FIG. 1 is a block diagram illustrating an example of an integrate and fire analog-to-pulse converter (IFC) in accordance with various embodiments of the present disclosure.

Disclosed herein is a different methodology to operate algebraically with time signals, which can be embodied on several pulse based arithmetic units, without using the binary arithmetic of conventional computers and conventional ADC converters of digital signal processing. The methodologies covered by the current disclosure will exploit the time domain nature of the pulse trains that decompose with high resolution the area under the curve of the analog signal in rectangles of constant area. When performing in real time binary operations on pulse trains (such as addition or multiplication), the disclosed methods will operate with the most recent pairs of pulses from each one of the IFC pulsed outputs, and will create a resulting pulse train that will correspond to the addition or multiplication of the instantaneous amplitude of the corresponding analog signals, effectively substituting the binary addition and multiplication of the conventional digital signal processing systems. Examples of systems and methods of performing addition and multiplication of two pulse trains generated by an integrate and fire analog-to-pulse converter (IFC) are disclosed.

Analog signals with finite bandwidth existing in nature can be represented by a bipolar integrate and fire analog to pulse converter (IFC). Because the IFC creates bipolar pulses that reflect a constant area under the analog signal, it imposes a constraint on the time structure of pulse trains that can be exploited for arithmetic using solely time based operators. It is important to contrast this disclosed methodology with alternative approach of working with pulse trains that have been called neuromorphic computing. In neuromorphic computing the pulses (spikes) have a stochastic (random) origin, while in the disclosed methodology we assume that pulses are deterministic and exactly quantifying the area under the analog signal. Moreover, neuromorphic computing uses the analog domain to integrate combination of pulse trains, while in the disclosed methodology we solely operate with time domain operators on the pulse trains, which do not require integration (time to amplitude conversion). Therefore the operation of addition and multiplication as disclosed herein, have a domain of applications as large as the conventional binary operations of addition and multiplication used in digital signal processors with ADCs and are different from neuromorphic computing. Moreover, an IFC can be more efficient for some classes of signals (impulsive signals) than an ADC.

The disclosed methodology can be contrasted with a neuromorphic computing approach of working with pulse trains. In neuromorphic computing the pulses (spikes) have a stochastic (random) origin, while in the disclosed methodology it is assumed that pulses are deterministic and exactly quantify the area under the analog signal. Moreover, neuromorphic computing uses the analog domain to integrate combination of pulse trains, while the disclosed methodology solely operates with time domain operators on the pulse trains, which do not require integration (time to amplitude conversion). Therefore the operation of addition and multiplication as disclosed herein, have a domain of applications as large as the conventional binary operations of addition and multiplication used in digital signal processors with ADCs and are different from neuromorphic computing. Moreover, an IFC can be more efficient for some classes of signals (impulsive signals) than an ADC.

In some embodiments, a pulse domain adder configuration can receive pulse trains, decode the underlying areas, add the areas together and generate an output pulse train that corresponds to the addition of the corresponding analog signals presented to the IFC. In other embodiments, a pulse domain multiplier configuration can receive pulse trains, decode the underlying areas, multiply the areas together and generate an output pulse train that corresponds to the multiplication of the corresponding analog signals presented to the IFC. Examples of architecture and implementation schemes based on the pulse domain configurations are discussed. Reference will now be made in detail to the description of the embodiments as illustrated in the drawings, wherein like reference numbers indicate like parts throughout the several views.

In contrast to ADCs, input dependent samplers concentrate the representation on the high amplitude regions of the signal and under-represent the relatively lower amplitude noisy background, thereby reducing the overall bandwidth to a sub-Nyquist rate. One such input dependent sampler is the integrate-and-fire converter (IFC) where the signal is encoded in a series of time events rather than the uniformly spaced amplitude values. The pulse representation of an IFC can be as precise as conventional ADCs because it provides an injective mapping between analog signals and the pulses, providing an alternative to conventional Nyquist samplers.

The IFC model is a sampler, with its output codifying the variation of the integral of the signal. Information in an IFC encoded signal is in the timing between events referred to as pulses. Referring to FIG. 1, shown in a block level schematic diagram of an example of an IF converter 100. A continuous input x(t) 103 is convolved with an averaging function u(t) from a starting time $t_0$ and the result 106 is compared against two fixed thresholds $\{\theta_p,\theta_n\}$. When either of these thresholds is reached or exceeded, a pulse 109 corresponding to the polarity of the threshold crossed is generated at that time instant representing that the input signal reached the threshold value. The integrator is reset 112 and held at this state for a specific duration given by the refractory period ($\tau$) to prevent two pulses from being too close to each other and then the process repeats. Let $u(t)=e^{\alpha(t-t_{k+1})}$ be the leaky factor in the integration and $t_0$ be the starting time of the continuous signal x(t), then $$\theta_k = \int_{t_k+\tau}^{t_{k+1}} x(t) e^{\alpha(t-t_{k+1})} dt, \quad (1)$$

where $\theta_k=\{\theta_p,\theta_n\}$ and $\alpha$, $\tau>0$. The IF provides both linear constraints on the input, similar to an ADC, and constraints on the variation of the integral between the samples. A non-uniformly distributed set of events is generated by this process, which is referred to as a pulse train. The pulse train generated by IF represents the amplitude of the real world analog signal through an injective mapping, with a unique inverse between the two representations. For the constraint function of equation (1), a level crossing sampler can be implemented by setting $\alpha=0$ and a delta-sigma modulator can be achieved by using a large value for $\alpha$.

The original analog waveform can be reconstructed from the output pulses of the IF sampler 100 to perform signal processing using conventional computers. However, this disclosure describes a pulse domain asynchronous adder and multiplier that receives the pulse trains as an input and produces an output pulse train that corresponds to addition and multiplication in the analog domain, respectively. Therefore the conventional signal processing operations, which are based on inner products, can be directly performed in the pulse domain. Such a pulse based unit can replace a normal arithmetic and logic unit in conventional digital signal processors, thereby expanding the operations on pulse trains to a new form of signal processing computation. Both the area and the power consumption of traditional digital signal processors may be reduced, which would impact implementations of mobile computing.

Addition

A pulse domain adder can take in two pulse trains as input, e.g., an augend pulse train and an addend pulse train, and can produce an output pulse train that corresponds to the sum of the augend and addend pulse trains. The pulse domain addition can rely on the fact that the time between two pulses represents a constant area under the analog curve. Therefore to add the two pulse trains, the net resultant sum of the area contribution at a given time can be found from both augend and addend pulse trains to generate the corresponding number of pulses (for constant areas resulting from augend and addend) in the output pulse train. Assuming $\alpha$ to be very small, calculation of the resultant sum of the area contribution involves solving the equation:

$$\int_a^b x(t)dt + \int_a^b y(t)dt = M \int_{S_n}^{S_{n+1}} \{x(t)+y(t)\} dt, \quad (2)$$

where x(t) and y(t) are continuous time signals corresponding to augend pulse train and addend pulse train respectively, and these two pulse trains and their sum pulse train have pulse times at $u_j,d_j$ and $s_j$ respectively and that $u_n,d_n \leq a < b \leq u_{n+1},d_{n+1}$. Solving the equation yields the resultant sum area and its associated timing:

$$N = p_u \left[\frac{b-a}{u_{n+1}-u_n}\right] + p_d \left[\frac{b-a}{d_{n+1}-d_n}\right] \quad (3)$$

$$s_{n+1} - s_n = \left|\frac{(u_{n+1}-u_n)\cdot(d_{n+1}-d_n)}{p_d(u_{n+1}-u_n)+p_u(d_{n+1}-d_n)}\right| \quad (4)$$

where $p_u$ and $p_d$ are the polarities of the augend and addend pulse times, and M=|N|. Thus, the pulses of the output pulse train represent the same constant area (generated with same IF parameters) as the augend and addend under its analog curve.

Addition with Respect to Addend Pulse Time.

Figure 2A:
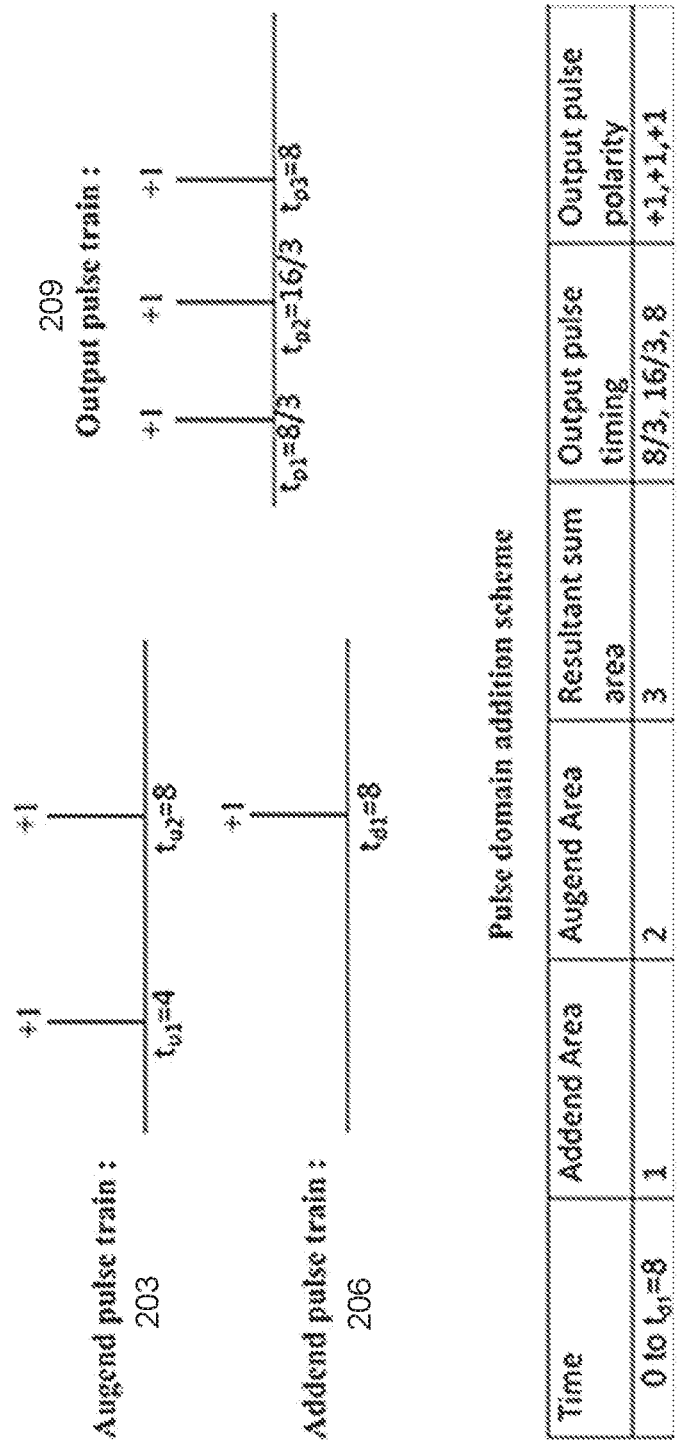
FIGS. 2A through 2D illustrate examples of pulse domain addition with respect to addend pulse time in accordance with various embodiments of the present disclosure.

With reference to the example of FIG. 2A, consider an augend pulse train 203 and an addend pulse train 206 representing two different signals and assume that the refractory period ($\tau$) is zero. To add the two pulse trains 203 and 206, the resultant sum of the area that both the augend and addend pulse trains contribute to can be found to determine the output pulse train at a given time. In the addend pulse train 206, from the starting time t=0 to the first pulse time $t=t_{d1}$ represents one constant area. During the same time period in the augend pulse train 203, there are two pulses at $t_{u1}$ and $t_{u2}$ representing two constant areas under the analog curve. When the addend and augend pulse trains 203 and 206 are added, there has to be three constant areas by time $t_{d1}$ (one constant area from addend 206 and two constant areas from augend 203), which are represented by three pulses in the output pulse train 209. The timing of the pulses can be obtained from the ratio of the time duration to the resultant sum area and the polarity can be given by the polarity of the resultant sum area (e.g., $t_{p1}=t_{d1}/3, t_{p2}=2t_{d1}/3, t_{p3}=t_{d1}$).

Figure 2B:
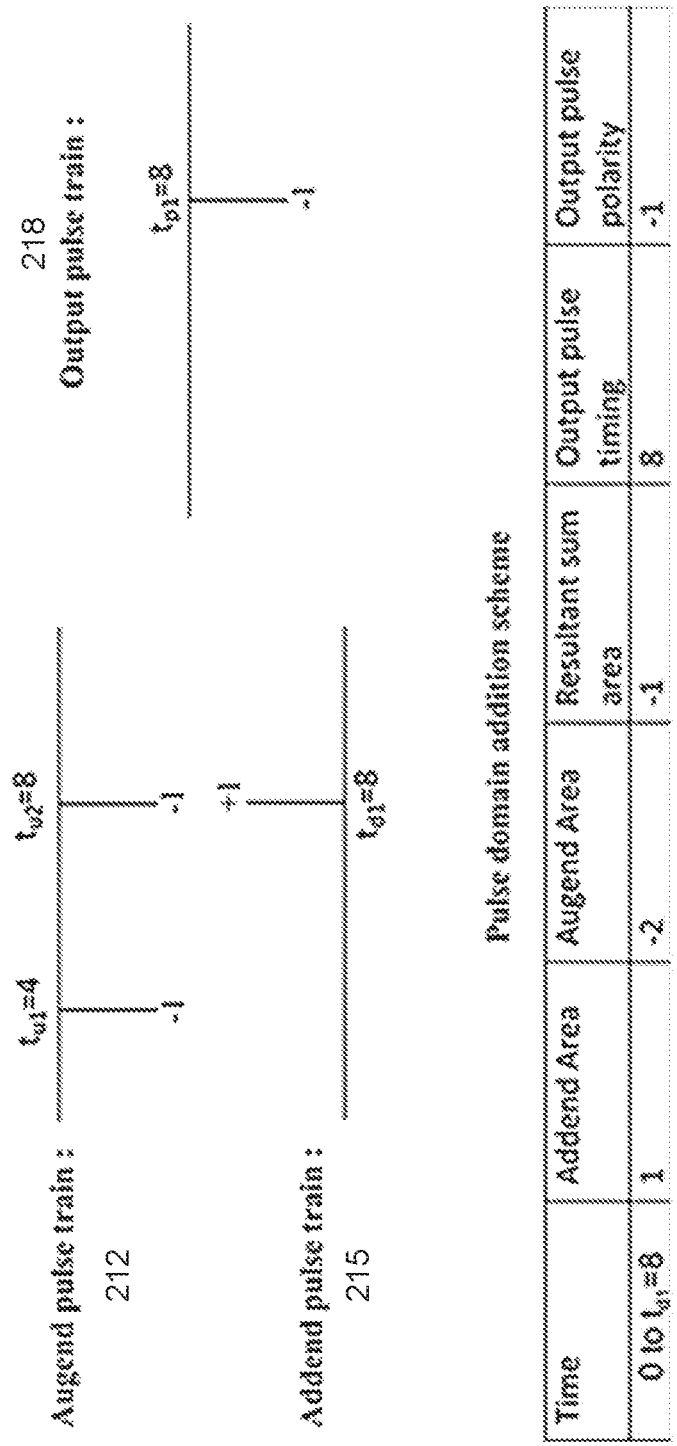

Referring next to the example of FIG. 2B, consider the augend pulse train 212 and addend pulse train 215 of different polarities. In the addend pulse train 215, from the starting time t=0 to the first pulse time $t=t_{d1}$ represents one constant area. During the same time period in the augend pulse train 212, there are two pulses at $t_{u1}$ and $t_{u2}$ representing two constant areas of opposite polarity under the analog curve. When the addend and augend pulse trains 215 and 212 are added, there has to be one constant area of negative polarity by time $t_{d1}$ which can be represented by a single pulse of negative polarity at $t=t_{d1}$ in the output pulse train 218.

Addition of Excess Areas with Respect to Addend Pulse Time.

In the examples of FIGS. 2A and 2B, the resultant sum of area at every instant of addend time was a whole number. If the resultant sum of area includes fractional digits, then it results in a remainder or excess area that has to be carried over to the next addend interval. Referring now to the example of FIG. 2C, consider augend pulse train 221 and addend pulse train 224. At the time $t_{d1}$ of the first pulse in the addend pulse train 224, the first pulse in the augend pulse train 221 has not yet been generated. This results in an excess area that can be carried over to the next addend interval. In the addend pulse train 224, one constant area is represented from the starting time t=0 to the first pulse time $t=t_{d1}$.

Figure 2C:
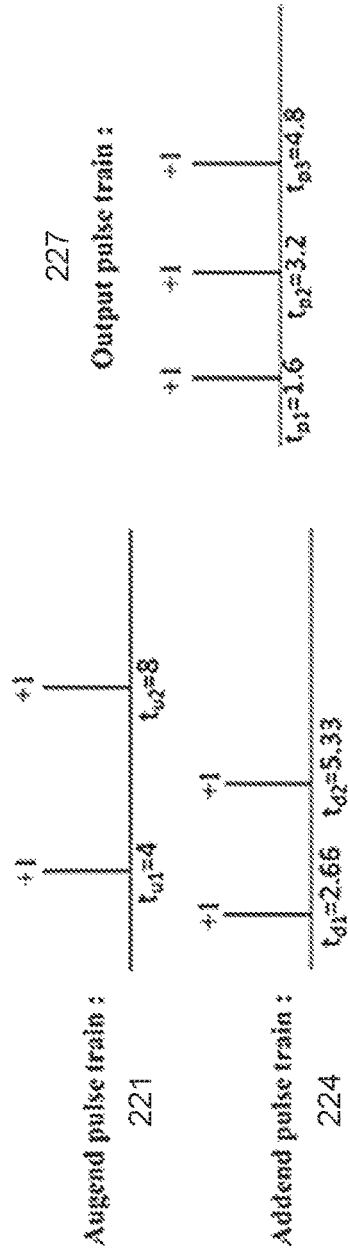

The same time period in the augend pulse train 221 represents two thirds of the constant area under the analog curve of the augend input. When the addend and augend pulse trains 224 and 221 are added, there is one constant area of positive polarity and its timing is given by the ratio of the time duration to the net area under both analog curves. In the example of FIG. 2C, the augend area can be determined as $(t_{d1}-0)/(t_{u1}-0)$ and the resultant sum of the augend area and addend area can be given by $1+(t_{d1}/t_{u1})$. Since there was no excess from the preceding constant area of the augend input, the output pulse timing is given by the ratio of the time duration to the net area $$\frac{t_{d1}-0}{1+(t_{d1}/t_{u1})}, \quad (5)$$

where the actual values are indicated in the table of FIG. 2C. The excess two thirds of the constant area is carried over to the next interval from $t_{d1}$ to $t_{d2}$ of the addend pulse train 224, where it is added with one third of the constant area from that interval to generate the next output pulse at $t_{p2}$ in the output pulse train 227. Determination of the remaining output pulse timing is illustrated in the table in FIG. 2C. Since the output with respect to the addend pulse times, the final pulse is determined based upon the next pulse in the addend pulse train 224.

Addition of Excess Areas with Respect to Both Addend and Augend Pulse Times.

Figure 2D:
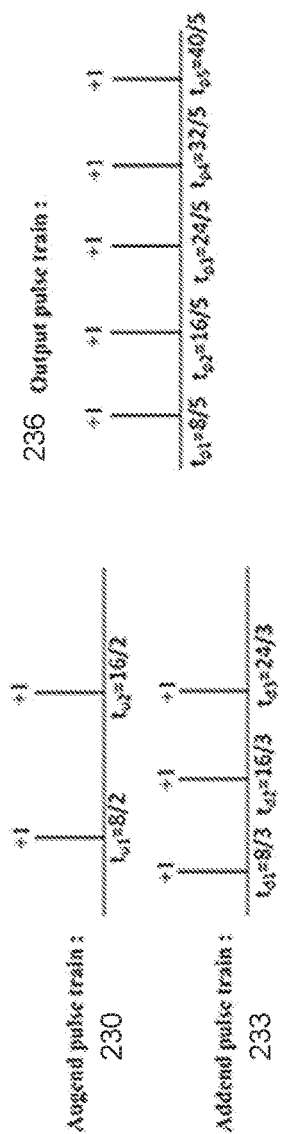

In the example of FIG. 2C, addition was carried out with respect to timings of the addend pulse train 224. However, in the case of aperiodic pulse trains, the interpulse intervals can vary significantly and hence addition can be done at every pulse time of both addend and augend pulse trains. An example of such a scheme is illustrated in FIG. 2D. The main difference between the examples of FIGS. 2A-2C and FIG. 2D is that computations are done at every pulse time. This is illustrated in the time column of the table in FIG. 2D, where the indicated pulse intervals switch between the augend pulse train 230 and addend pulse train 233. The procedure for determining the timing of the output pulse train 236 is similar to the computation of excess area in FIG. 2C, with the addend areas being determined for the intervals. The addition done at every pulse time of both the addend and augend pulse trains 230 and 236 is the most accurate and can subsume the examples of FIGS. 2A-2C. Note that the equal pulse times $t_{d3}=t_{u2}=t_{p5}$ in the example of FIG. 2D.

Figure 3A:
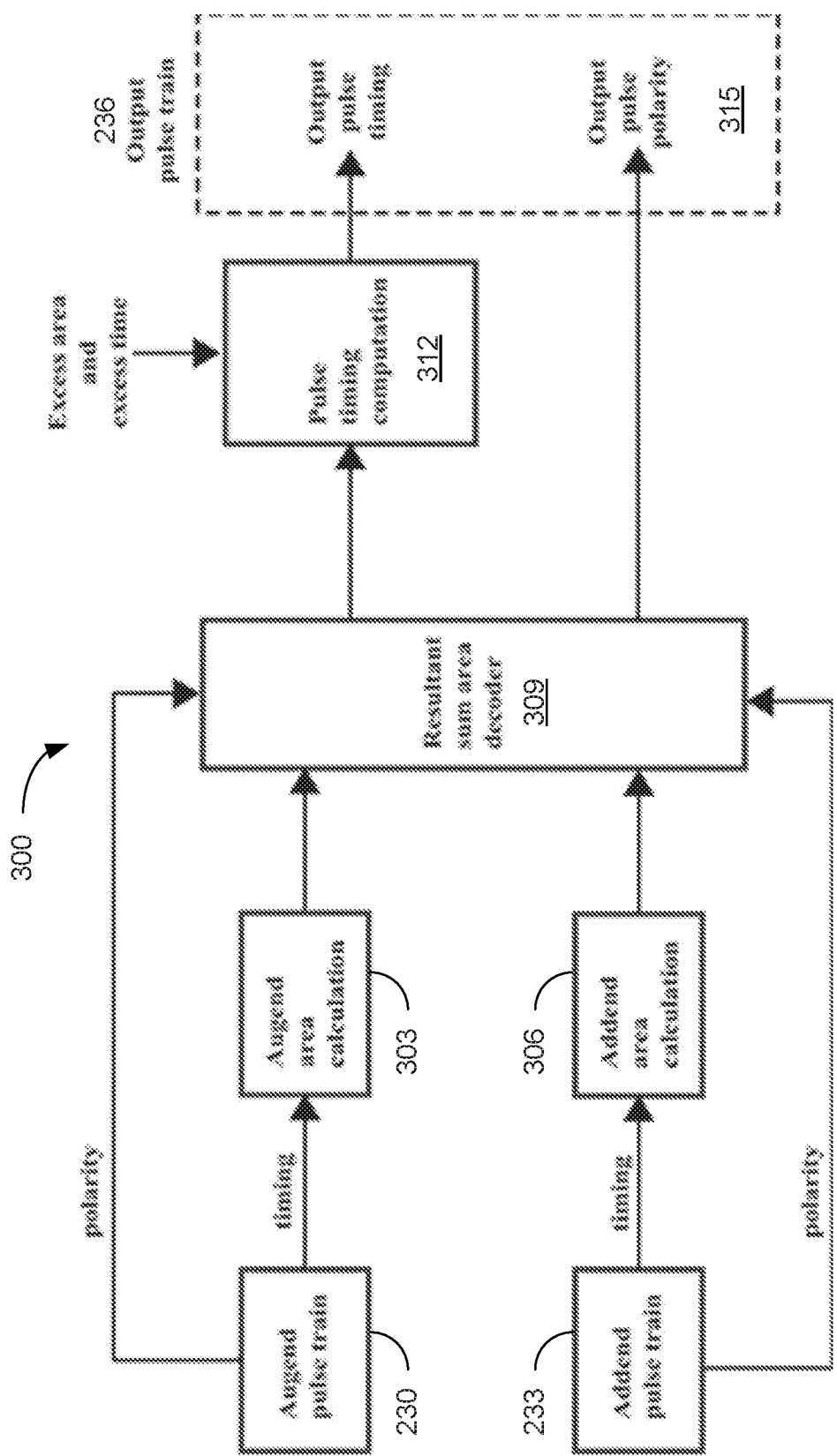
FIGS. 3A through 3C are schematic diagrams illustrating an example of a pulse domain adder architecture in accordance with various embodiments of the present disclosure.

Referring next to FIG. 3A, shown is a schematic representation of an example of a pulse domain adder architecture. The overall architecture of the pulse domain adder 300 of FIG. 3A is based on the steps involved in the pulse domain addition of excess areas as illustrated in FIG. 2D. The augend area and the addend area are calculated by calculation circuitry 303 and 306, respectively, from the time difference between the pulses of the two pulse trains 230 and 233. The resultant constant area at a given time is decoded by a resultant sum area (RSA) decoder 309 from the determined addend area and augend area and the corresponding polarities of the pulses. The augend and addend pulse trains 230 and 233 can be monitored and an indication of the polarity of the most recent pulse provided to the RSA decoder 309. Then the output pulse time can be determined by pulse timing computation circuitry 312 and output pulse polarity can be computed from the net area by the RSA decoder 309 while accounting for the excess area as illustrated in FIG. 2D. Pulse train circuitry 315 can then generate the output pulse train 236 based upon the output pulse timing and polarity.

Figure 3B:
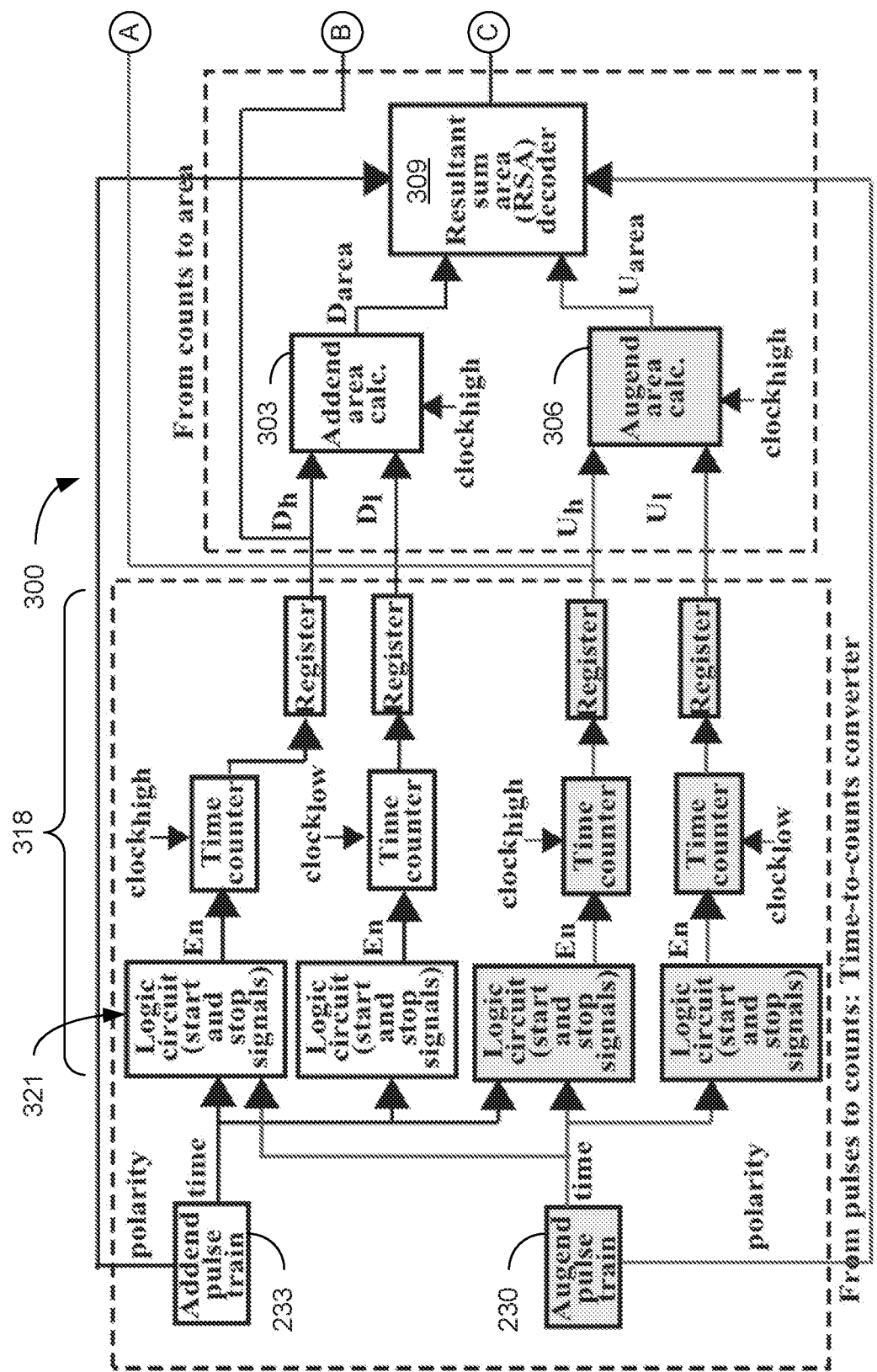
Figure 3C:
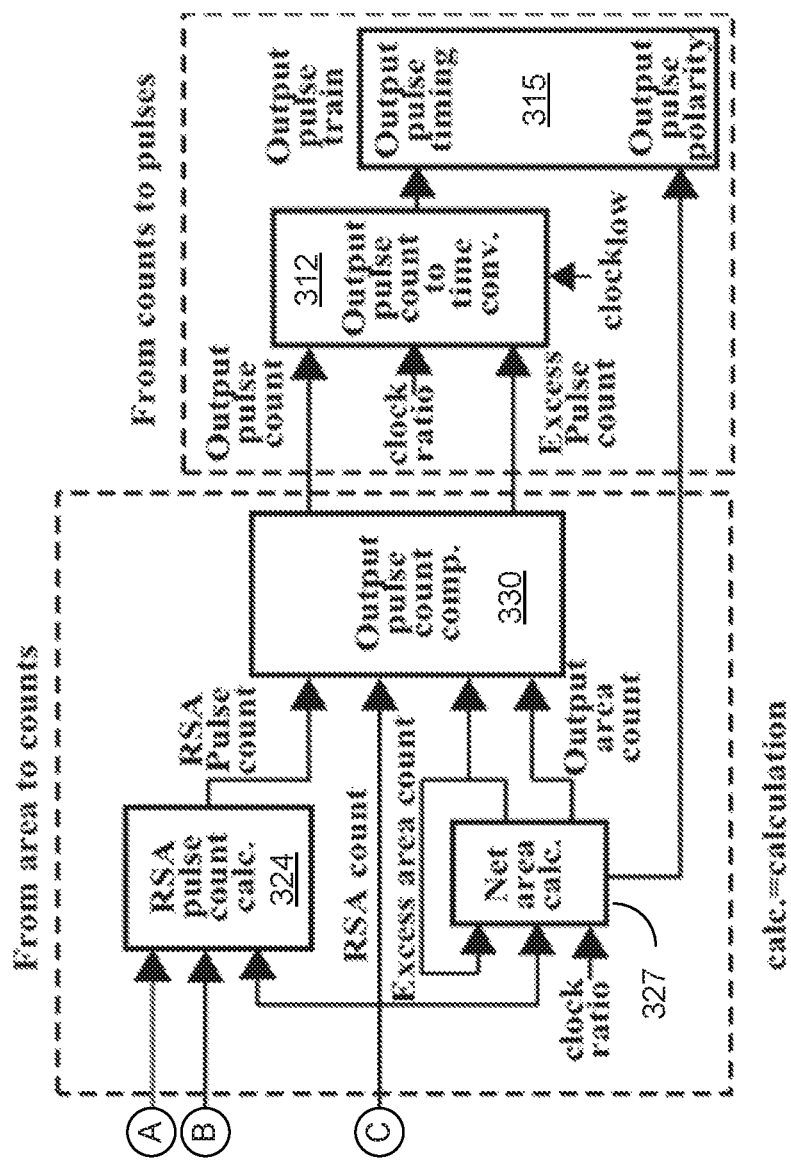
Figure 4A:
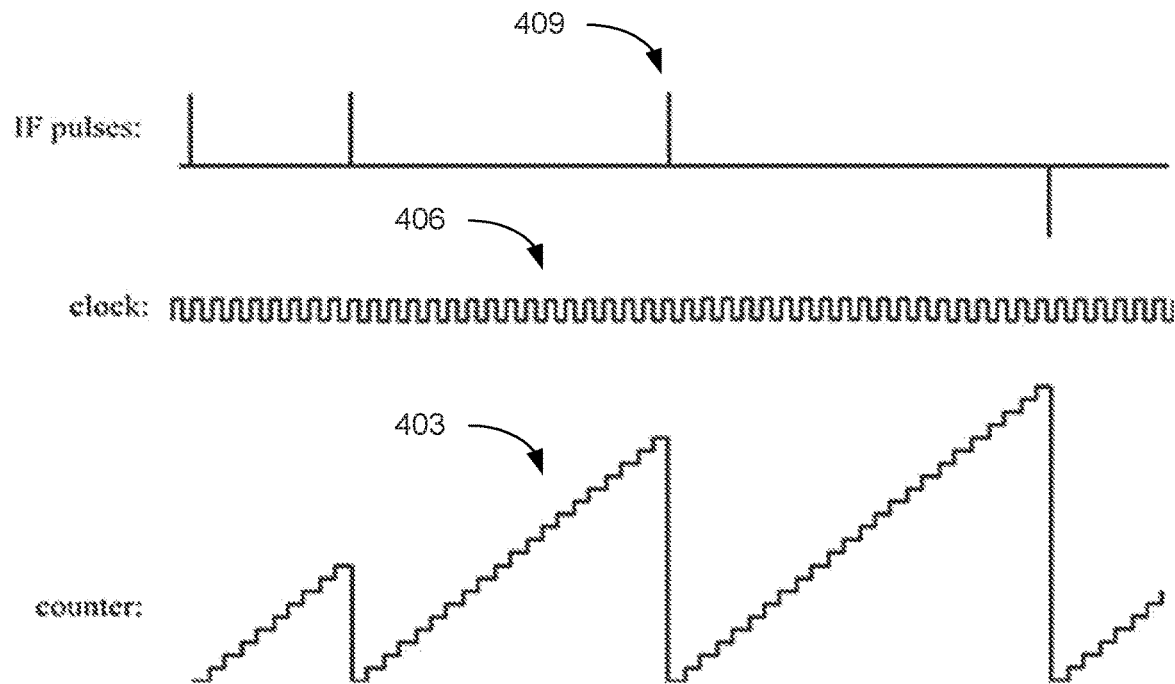
FIGS. 4A and 4B illustrate examples of integrate-and-fire (IF) pulse timings for the pulse domain adder architecture in accordance with various embodiments of the present disclosure.

FIGS. 3B and 3C show one possible embodiment of a pulse domain adder 300 based upon the exemplary architecture of FIG. 3A. A time-to-counts converter (TCC) 318 can be used for measuring time between events in the pulse domain adder 300. It can recognize the IFC pulse events and provide a digital representation (counts) of the time between pulses. An illustration of the conversion of IF pulse timings into counts by TCC is shown in FIG. 4A. As shown, the digital counts 403 incrementally increase at each clock cycle 406 until it is reset by an IF pulse 409.

Figure 4B:
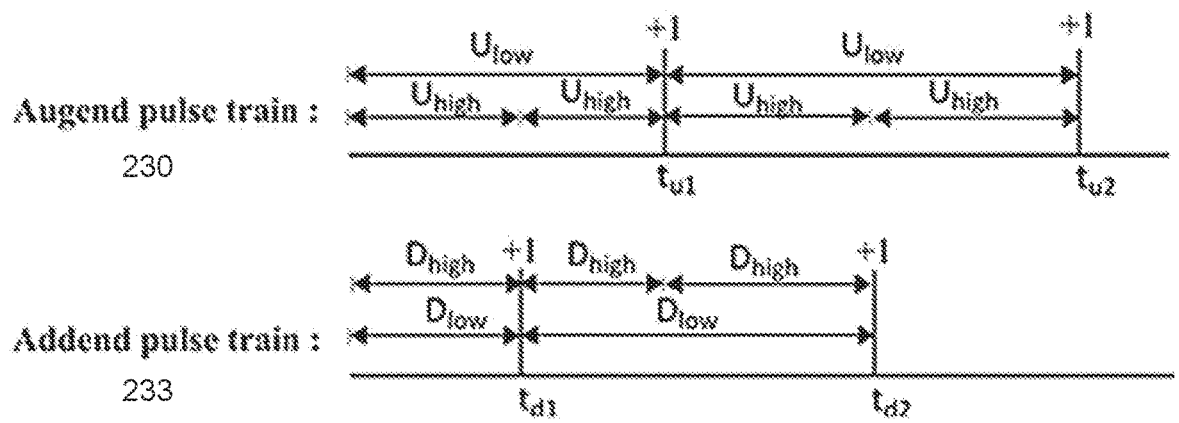

As shown in FIG. 3B, the TCC 318 operates on two different clock speeds on both the addend and augend pulse trains 230 and 233. The start and stop logic circuitry 321 of the TCC 318 with higher clock speed (clock$_{high}$) are controlled by the IF pulses of both the addend and augend pulse trains 230 and 233. On the other hand, the start and stop logic circuitry 321 of the TCC 318 with lower clock speed (clock$_{low}$) operates over the addend and augend pulse trains 230 and 233 separately. This is illustrated in FIG. 4B, which shows an example of the TCC 318 high and low clock controls with respect to the addend and augend pulse trains 230 and 233 using the TCC 318.

The area corresponding to the digital counts 403 (FIG. 4A) of the TCC 318 is computed in the addend and augend area calculation circuitry 303 and 306. The addend and augend area calculation circuitry 303 and 306 includes decrement counters that take two count values as inputs and produce an output count that is the ratio of the two inputs. The output count of each area calculation circuitry 303 and 306 represents the addend and augend areas, respectively.

Figure 5A:
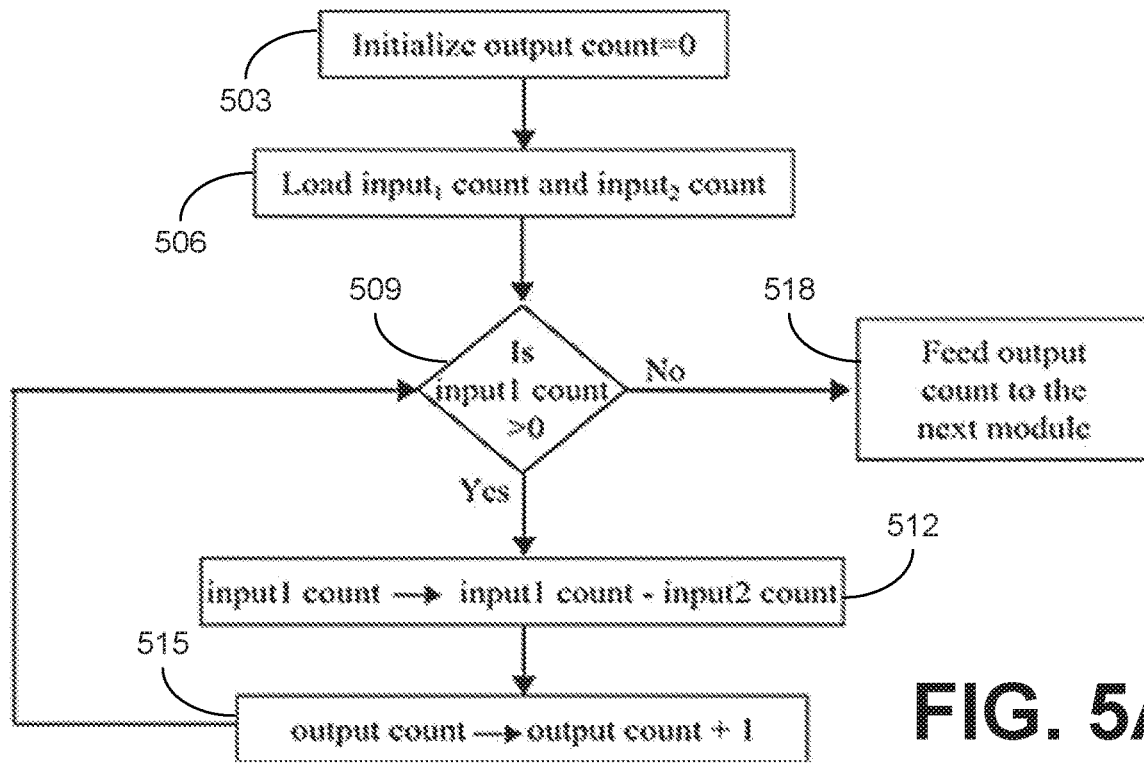
FIGS. 5A through 5D are flow charts illustrating various operations of the pulse domain adder architecture in accordance with various embodiments of the present disclosure.

An example of the process flow of the decrement counter for finding the ratio of two counts is shown in FIG. 5A. Beginning with 503, the output count is initialized as zero. Input$_1$ and input$_2$ counts are then loaded at 506. If the input$_1$ count is greater than zero at 509, then the input$_1$ count is updated to the difference of the input$_1$ and input$_2$ counts at 512 and the output count is incremented at 515 before the flow returns to 509. If the input$_1$ count is not greater than zero at 509, then the output count is feed to the next module at 518.

Figure 5B:
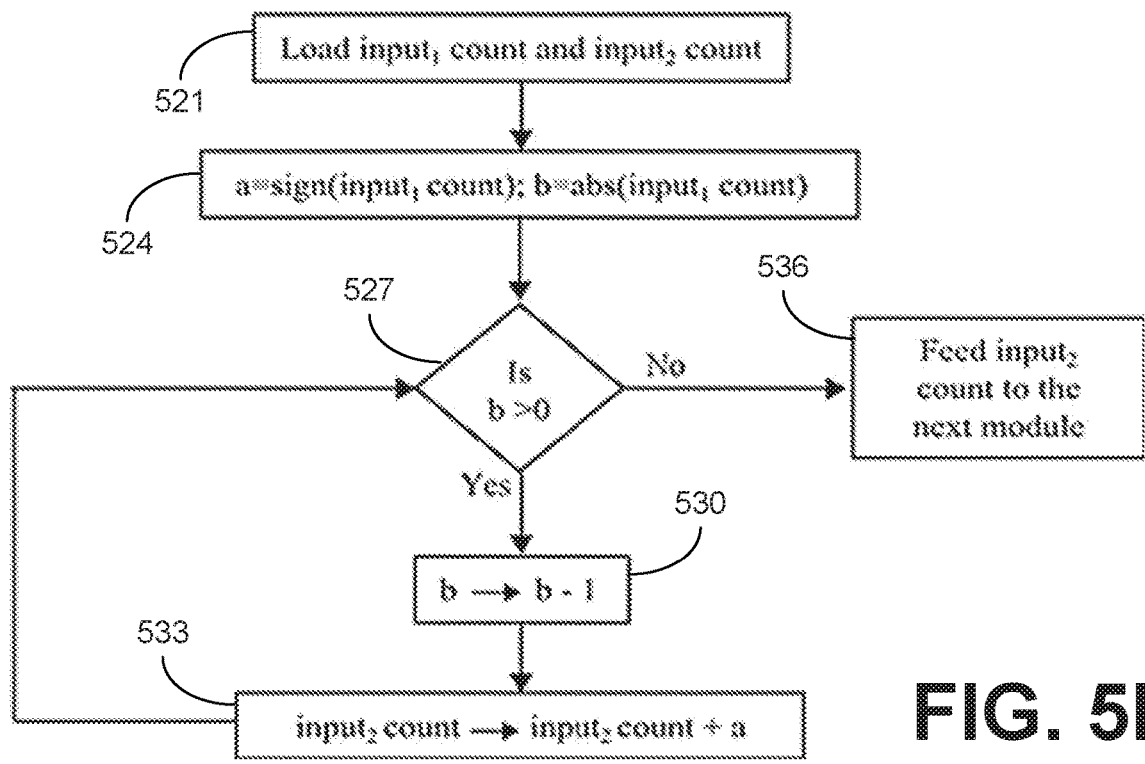

Referring back to FIG. 3B, the resultant sum area (RSA) can be computed by adding the polarized-areas (multiplying the area by the polarity of the IF pulse) of both the addend and augend. This can be done in the RSA decoder 309 that takes in the polarized counts (product of area counts and polarity of the pulse) as inputs and produce RSA count that is the sum of the two input counts. An example of the process flow of the sum counter for finding the sum of the two counts is shown in FIG. 5B. Beginning with 521, the input$_1$ and input$_2$ counts are loaded. At 524, the sign and magnitude of the input$_1$ count is determined. If the magnitude of the input$_1$ count is greater than zero at 527, then the magnitude is reduced by one at 530 and the input$_2$ count is adjusted based upon the sign of the input$_1$ count at 533 before returning to 527. If the magnitude of the input$_1$ count is not greater than zero at 527, then the input$_2$ count is feed to the next module.

Referring back to FIG. 3C, RSA pulse count calculation circuitry 324 can include a decrement counter that takes as input the RSA count and time duration count (obtained from addend and augend counts from higher clocks). Its output, the RSA pulse count which is a ratio of time duration and RSA count, represents the count of the timing due to the current RSA. In the net area calculation circuitry 327, the net area is given by the sum of the RSA and excess area which is done in a sum counter. Since the ratio of the two clock speeds represents the constant area, the output area count can be given by the floor of the net area and clock ratio, and the remaining fractional area can be the excess area count. Output pulse count computation circuitry 330 can obtain the output pulse count and excess pulse count by multiplying the output area count by the RSA pulse count and by multiplying the excess area count by the RSA pulse count, respectively.

Figure 5C:
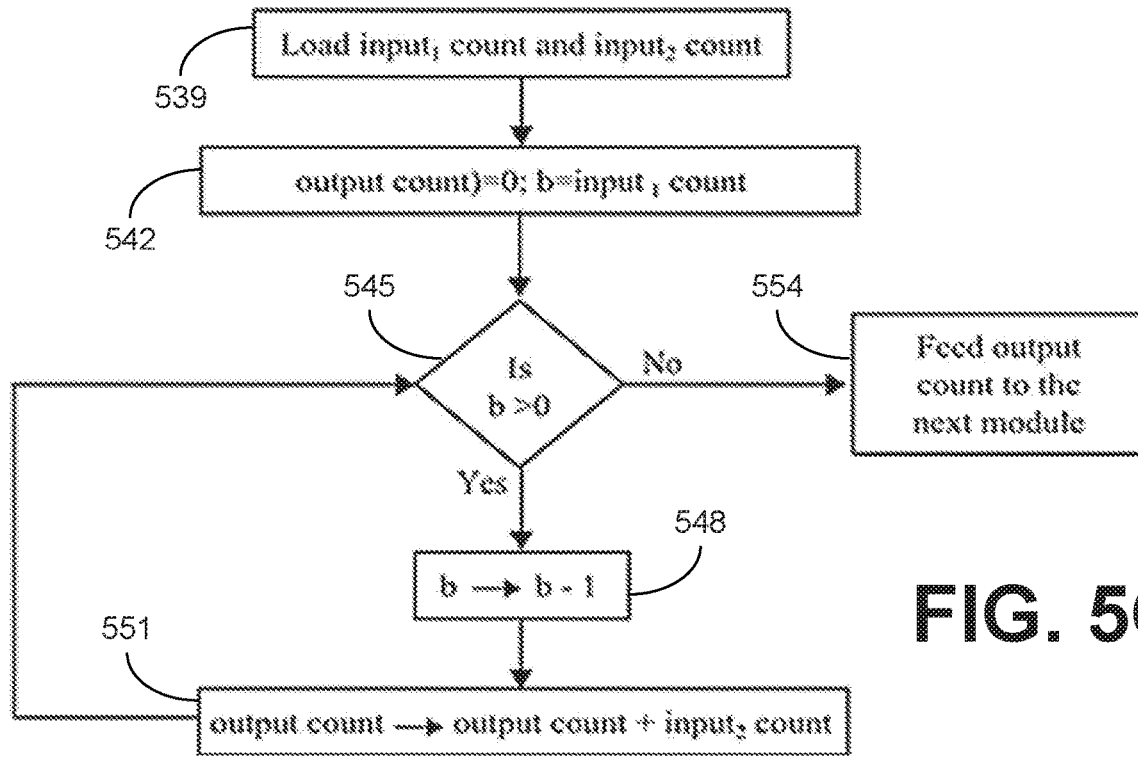

An example of the implemented process flow of the product counter for finding the product of two counts is shown in FIG. 5C. Beginning with 539, the input$_1$ and input$_2$ counts are loaded and the output count is set to zero at 542. If the input$_1$ count is greater than zero at 545, then the input$_1$ count is decremented by one at 548 and the output count is increased by the input$_2$ count at 551 before returning to 545. If the input$_1$ count is not greater than zero at 545, then the output count is feed to the next module at 554.

Figure 5D:
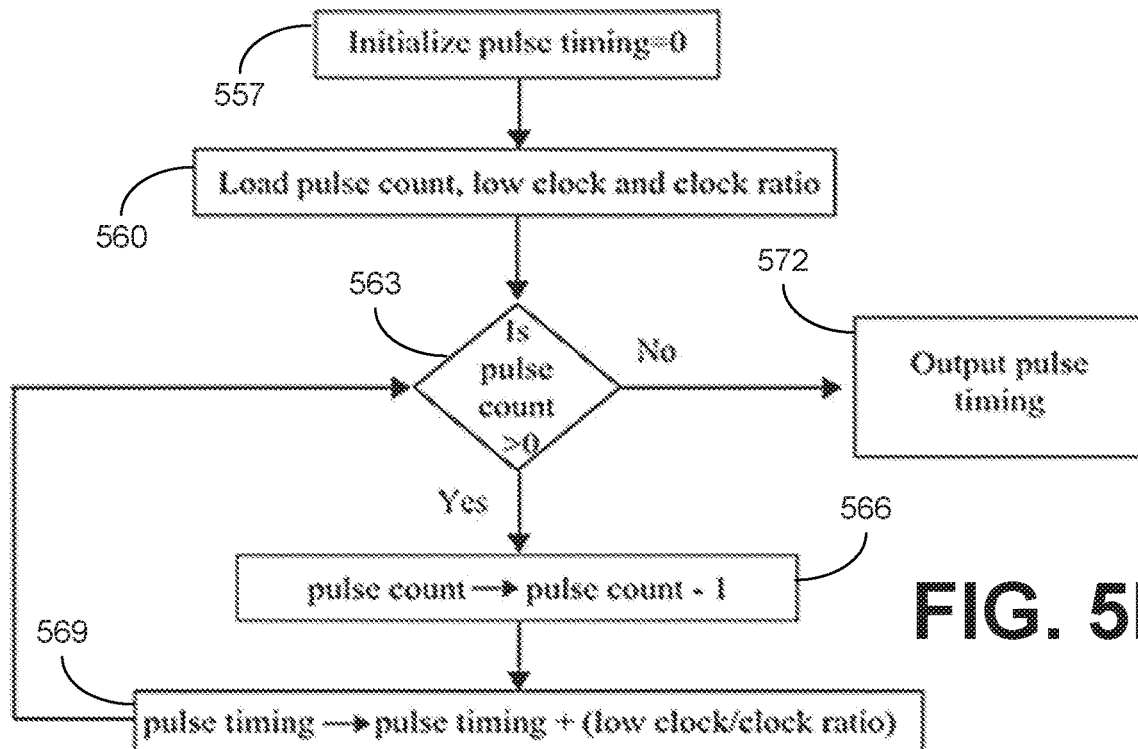

The pulse timing computation circuitry 312 can convert the pulse counts back to pulse timings as shown in FIG. 3C. The precision of the operation can be controlled by the ratio of the two clocks. An example of the implemented process flow of the conversion of pulse counts into pulse timings is shown in FIG. 5D. Beginning at 557, the pulse timing is initialized as zero. The pulse count, low clock and clock ratio is loaded at 560. If the pulse count is greater than zero at 563, then the pulse count is decremented by one at 566 and the pulse timing is increased by the low clock and inverse of the clock ratio at 569 before returning to 563. If the pulse count is not greater than zero at 563, then the pulse timing is output at 572.

Figure 6A:
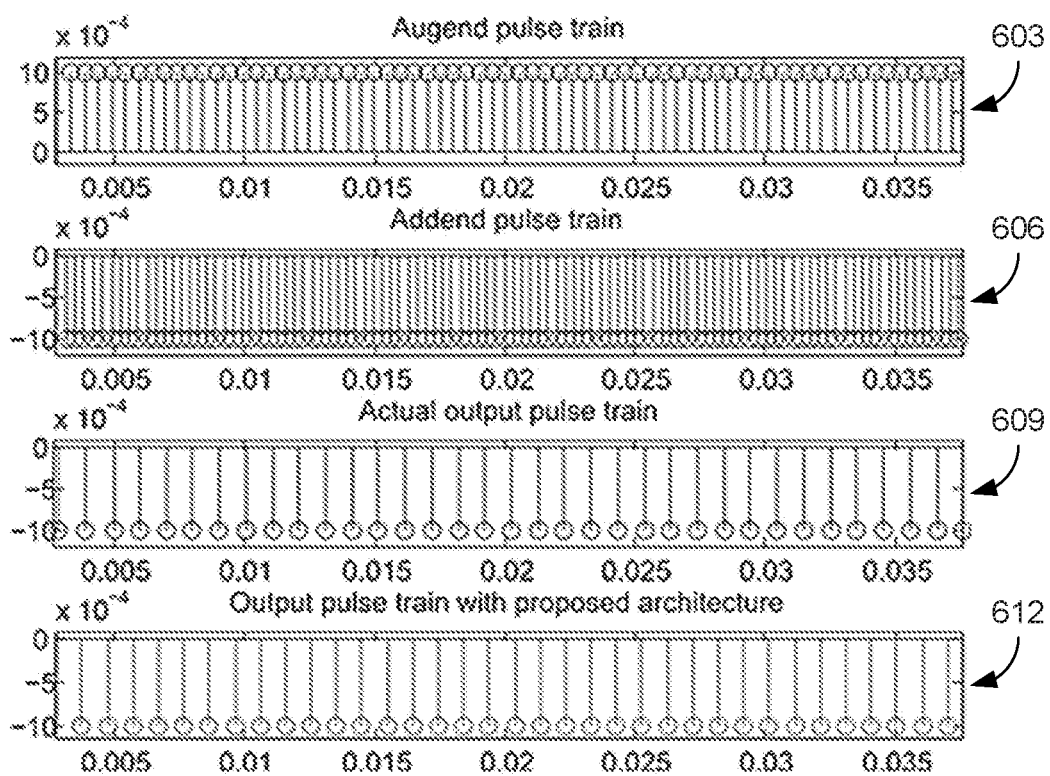
FIGS. 6A through 6D illustrate pulse trains and corresponding reconstructed signals of the pulse domain adder architecture in accordance with various embodiments of the present disclosure.
Figure 6B:
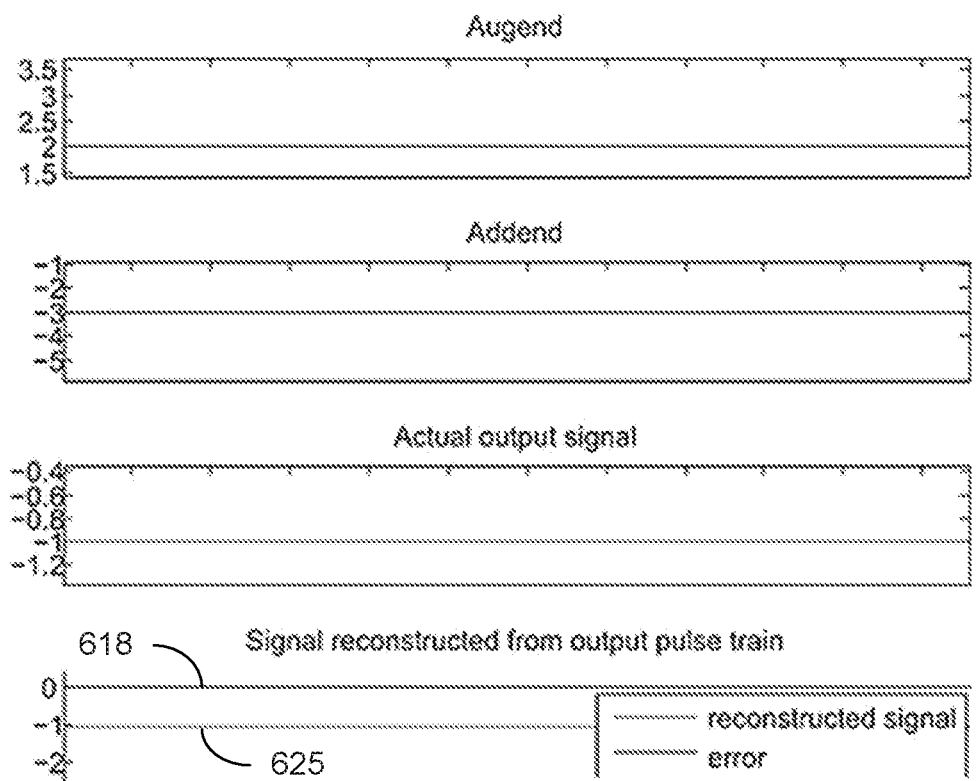
Figure 6C:
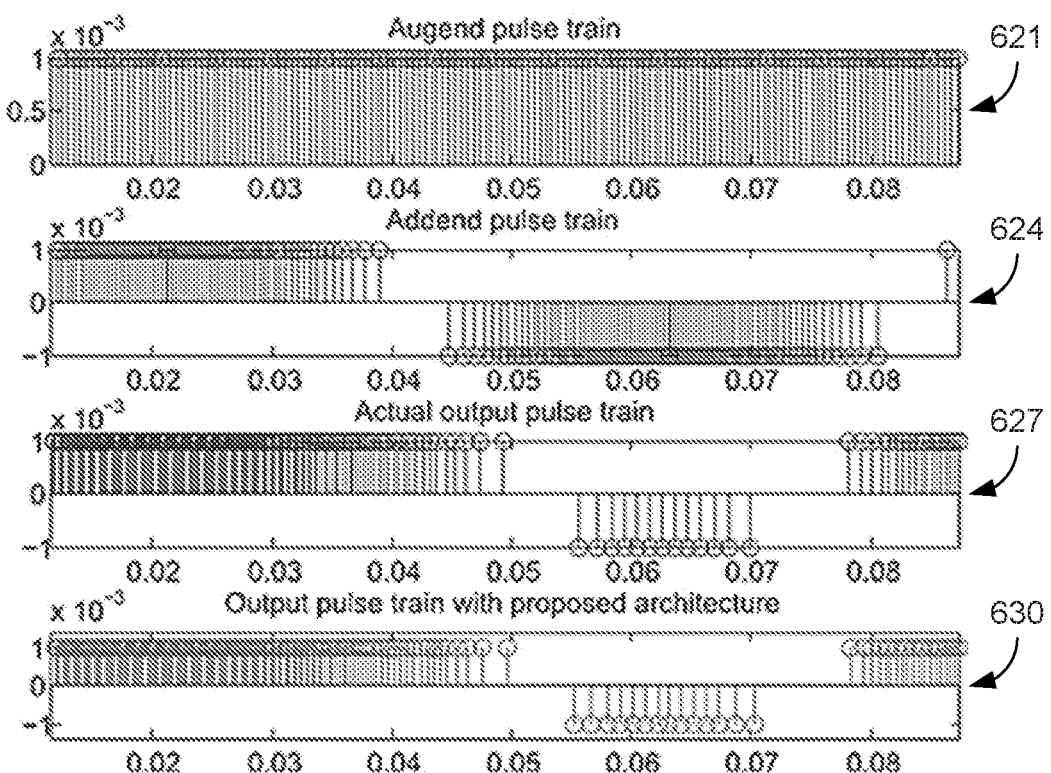
Figure 6D:
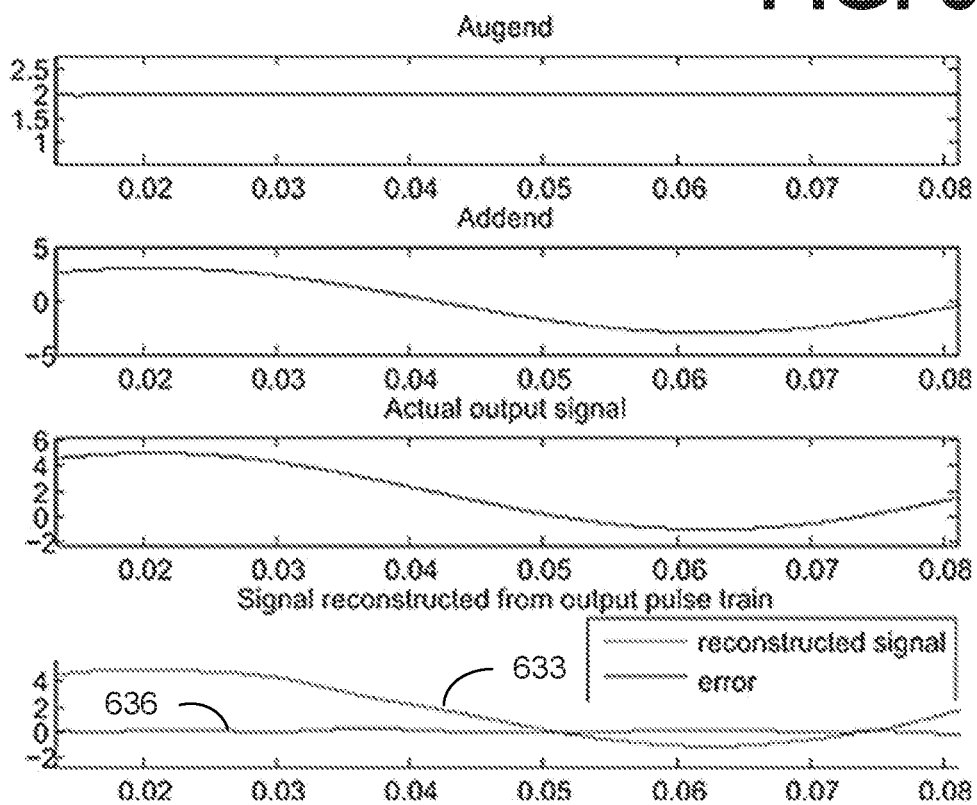

Simulations based on the pulse domain adder architecture were done with the following clock speeds: clock$_{high}$=100 MHz, clock$_{low}$=1 MHz. In FIG. 6A, the pulse domain addition of two periodic pulse trains is illustrated. The augend pulse train 603 includes a series of positive pulses and the addend pulse train 606 includes a series of negative pulses. FIG. 6A shows the actual output pulse train 609 and the output pulse train 612 of the pulse domain adder architecture. The reconstructed signals are shown in FIG. 6B, including the reconstructed signal 615 from the pulse domain adder architecture and the error 618 of the reconstructed signal 615. In FIG. 6C, the pulse domain addition of a non-periodic pulse train and a periodic pulse train are illustrated. The augend pulse train 621 includes a series of positive pulses and the addend pulse train 624 includes a non-periodic series of positive and negative pulses. FIG. 6C shows the actual output pulse train 627 and the output pulse train 630 of the pulse domain adder architecture. The reconstructed signals are shown in FIG. 6D, including the reconstructed signal 633 from the pulse domain adder architecture and the error 636 of the reconstructed signal 633.

Thus, the sequence of steps in pulse train addition process is as follows:

a) Calculate resultant area:

$$N = p_u \left[ \frac{b-a}{u_{n+1} - u_n} \right] + p_d \left[ \frac{b-a}{d_{n+1} - d_n} \right].$$

b) Case 1: N≠0 and |N+N$_{ex}$|≥1, where N$_{ex}$ is the excess area and (e$_{n+1}$−e$_n$) is excess area time.
  i. Resultant area time:

$$s_{n+1} - s_n = \left| \frac{(u_{n+1} - u_n) \cdot (d_{n+1} - d_n)}{p_d(u_{n+1} - u_n) + p_u(d_{n+1} - d_n)} \right|$$

ii. Pulse output time: O$_i$−O$_{i-1}$=(e$_{n+1}$−e$_n$)+(s$_{n+1}$−s$_n$)(1−|N$_{ex}$|).
  iii. Update: N→N−(1−N$_{ex}$); N$_{ex}$=N; (e$_{n+1}$−e$_n$)=b−O$_i$
c) Case 2: N≠0 and |N+N$_{ex}$|<1
  Update: N$_{ex}$→N$_{ex}$+N; (e$_{n+1}$−e$_n$)=b−O$_i$ d) Case 3: N=0
  Update: N$_{ex}$→N$_{ex}$; (e$_{n+1}$−e$_n$)=b−O$_i$ It is to be noted that if no constraint is on α, then, instead of equation (2), calculation of the resultant sum of the area contribution involves solving the equation:

$$\int_a^b x(t)e^{-\alpha(u_{n+1}-t)}dt + \int_a^b y(t)e^{-\alpha(d_{n+1}-t)}dt = M\int_{S_n}^{S_{n+1}} \{x(t) + y(t)\}e^{-\alpha(s_{n+1}-t)}dt \quad (6)$$

Solving equation (6) yields:

$$s_{n+1} - s_n = \frac{-1}{\alpha} \ln\left(1 - \left| \frac{g(u_{n+1} - u_n) \cdot g(d_{n+1} - d_n)}{p_u g(u_{n+1} - u_n) + p_d g(d_{n+1} - d_n)} \right|\right) \quad (7)$$

where p$_u$ and p$_d$ are the polarities of the augend and addend pulse times, and g(m)=1−e$^{-\alpha(m)}$. Using equation (7), similar pulse adder structures and processes can be derived by including logarithm and exponential blocks in the architecture.

Multiplication

A pulse domain multiplier can take in two pulse trains as input, e.g., the multiplicand pulse train and multiplier pulse train, and can produce an output pulse train that corresponds to the multiplication of the multiplicand and multiplier pulse train. The presented pulse domain multiplication can rely on two facts. First and foremost, if the time between pulses of the multiplier corresponds to a number less than one under the analog curve, then it leads to time expansion in the multiplicand. Secondly, the time between two pulses represents a constant area under the analog curve. To multiply the two pulse trains, the area contribution of the multiplier can be found with respect to a reference of one under the analog curve as well as the corresponding multiplicand area at a same time. From these two areas, the timing of pulses in the output pulse train can be determined. Assuming α to be very small, calculation of the resultant product of the area contribution involves solving the equation:

$$\frac{\int_a^b x(t)dt \int_a^b y(t)dt}{\int_a^b 1 \cdot dt} = M \int_{p_n}^{p_{n+1}} \{x(t) \cdot y(t)\}dt \quad (8)$$

where x(t) and y(t) are continuous time signals corresponding to multiplicand pulse train and multiplier pulse train respectively, and these two pulse trains, their product and the reference pulse train have pulse times of positive polarity at u$_j$,d$_j$,p$_j$ and r$_j$, respectively, with u$_n$,d$_n$,r$_n$≤a<b≤u$_{n+1}$,d$_{n+1}$,r$_{n+1}$. Solving equation (8) yields the resultant product area and its associated timing:

$$N = p_u \left[ \frac{r_{n+1} - r_n}{u_{n+1} - u_n} \right] p_d \left[ \frac{b-a}{d_{n+1} - d_n} \right] \quad (9)$$

$$p_{n+1} - p_n = \left| \frac{(u_{n+1} - u_n) \cdot (d_{n+1} - d_n)}{(r_{n+1} - r_n)} \right| \quad (10)$$

where p$_u$ and p$_d$ are the polarities of the multiplicand and multiplier pulse times and M=|N|.

Multiplication with Respect to Multiplier Pulse Time.

Figure 7A:
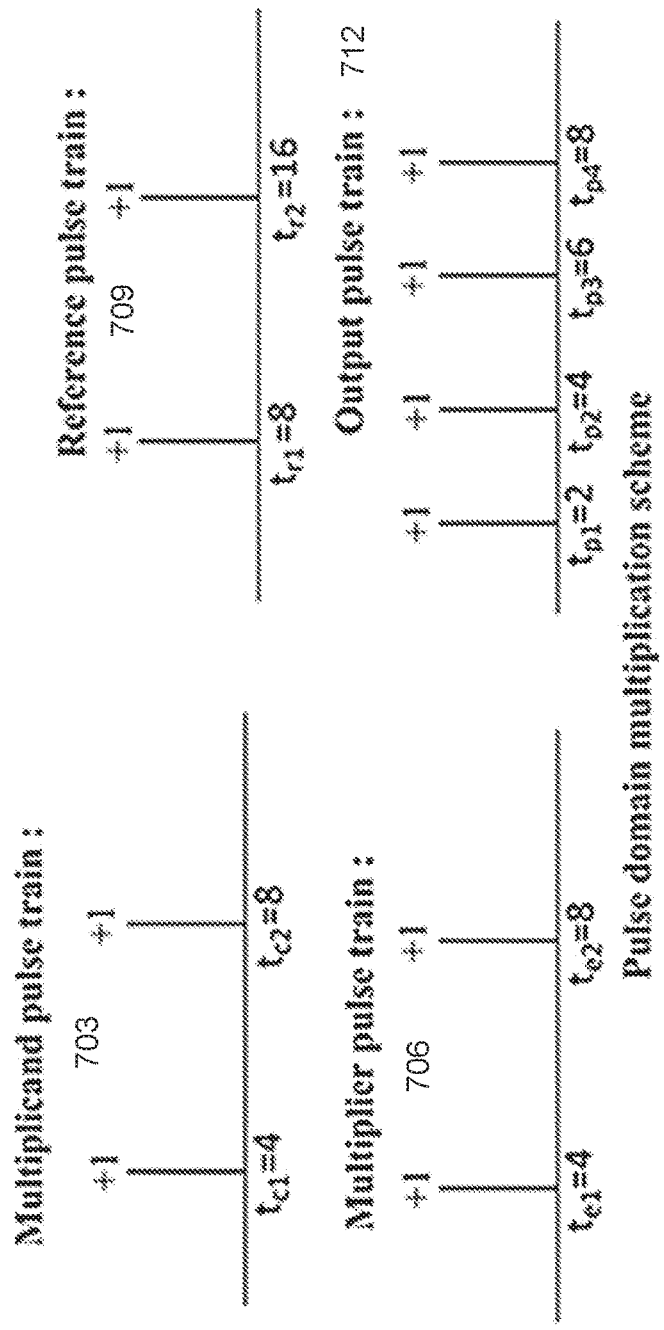
FIGS. 7A through 7C illustrate examples of pulse domain multiplication with respect to multiplier pulse time in accordance with various embodiments of the present disclosure.

With reference to the example of FIG. 7A, consider a multiplicand pulse train 703 and multiplier pulse train 706 representing two constant signals under the analog curve. The reference pulse train 709 is a periodic pulse train of duration t$_{r1}$ that corresponds to the constant one under the analog curve. In the multiplier pulse train 706, from the starting time t=0 to the first pulse time t=$t_{e1}$ represents one constant area. The relative area of the multiplier during this time interval is given by the ratio of $t_{r1}$ to the time interval ($t_{e1}$–0). This results in a relative area of 2, i.e., there are two constant areas in the multiplier for every constant area in the reference under the analog curve. During the same time interval in the multiplicand pulse train 703, there is one pulse at $t_{c1}$. When the two pulse trains 703 and 706 are multiplied, there has to be two constant areas by time $t_{e1}$. The timings of the pulses are obtained from the ratio of the time duration ($t_{e1}$–0) to the resultant product area (RPA). The polarity of the pulses of the output pulse train 712 can be given by multiplying the polarities of the multiplicand and multiplier pulses.

Multiplication of Excess Areas with Respect to Multiplier Pulse Time.

When the RPA due to multiplier and multiplicand includes fractional digits, then it results in a remainder or excess area that can be carried over to the next instance of multiplier interval. Referring now to the example of FIG. 7B, consider multiplicand pulse train 715 and multiplier pulse train 718. The relative area of the multiplier with respect to the reference pulse train 721 during the time interval [0,$t_{e1}$] is given by the ratio of $t_{r1}$ to $t_{e1}$. At the time instance of the first multiplier pulse ($t_{e1}$=8/2.5), the first multiplicand pulse ($t_{c1}$=8/2.3) has not yet been generated and its time interval represents less than one constant area under the analog curve. When the multiplicand and multiplier pulse trains 715 and 718 are multiplied, there are two constant areas of positive polarity and the excess three tenths of the constant area can be carried over to the next multiplier interval. The timing $t_{p1}$ of the output pulses is given by the ratio of the time duration ($t_{e1}$–0) to the RPA. The polarity of the pulses of the output pulse train 724 can be given by multiplying the polarities of the multiplicand and multiplier pulses.

Multiplication of Excess Areas with Respect to Multiplier Pulse Trains and Individual Multiplicand Pulse Intervals.

Figure 7B:
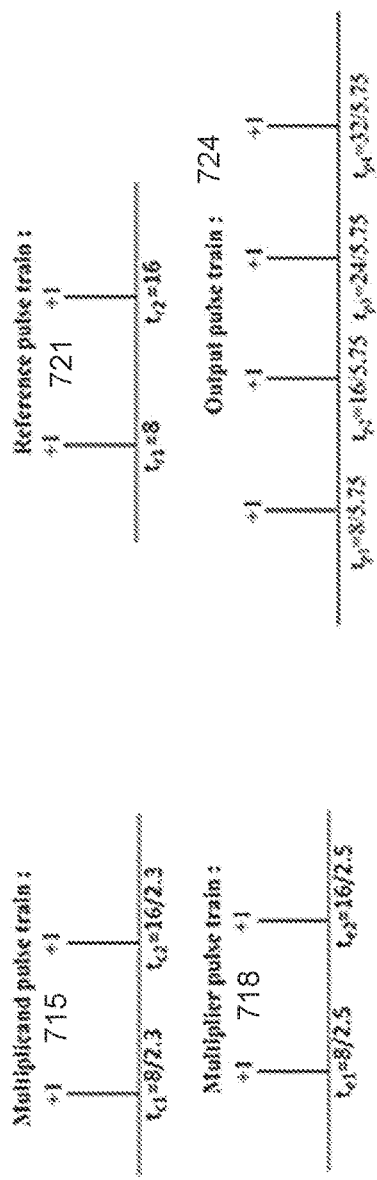
Figure 7C:
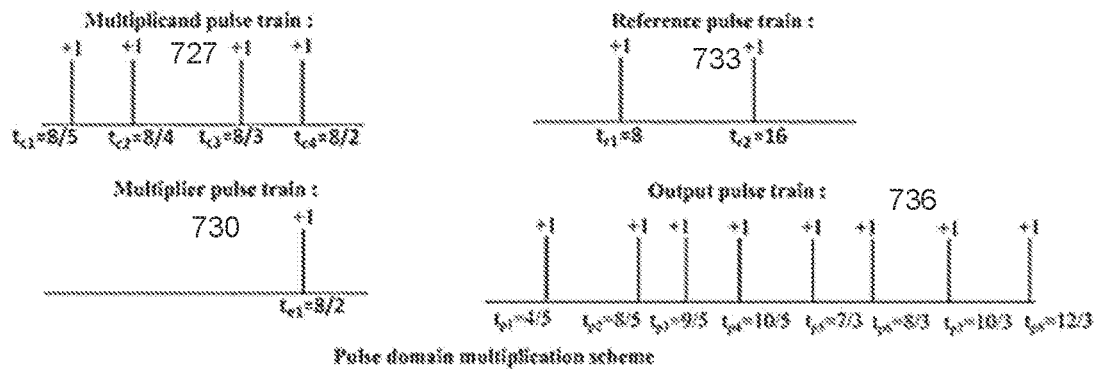

In the examples of FIGS. 7A and 7B, multiplication was done with respect to multiplier pulse timings while considering the cumulative effect of multiplicand for each multiplier interval. In the case of aperiodic pulse trains, the interpulse intervals can vary significantly and hence multiplication can be done with respect to multiplier pulse timings while accounting for every individual multiplicand pulse interval during the same timeframe. Referring to the example of FIG. 7C, the main difference between the examples of FIGS. 7A and 7B and FIG. 7C is that intervals of the multiplicand pulse train 727 within an interval of the multiplier pulse train 730 are accounted for separately. This is clearly shown by the multiplicand time in the third column of FIG. 7C. The rest of the procedure is similar to the computation of excess area in FIG. 7B. The multiplication done with respect to multiplier pulse timings while accounting for every individual multiplicand pulse interval is the most accurate and can subsume the examples of FIGS. 7A and 7B.

Figure 8A:
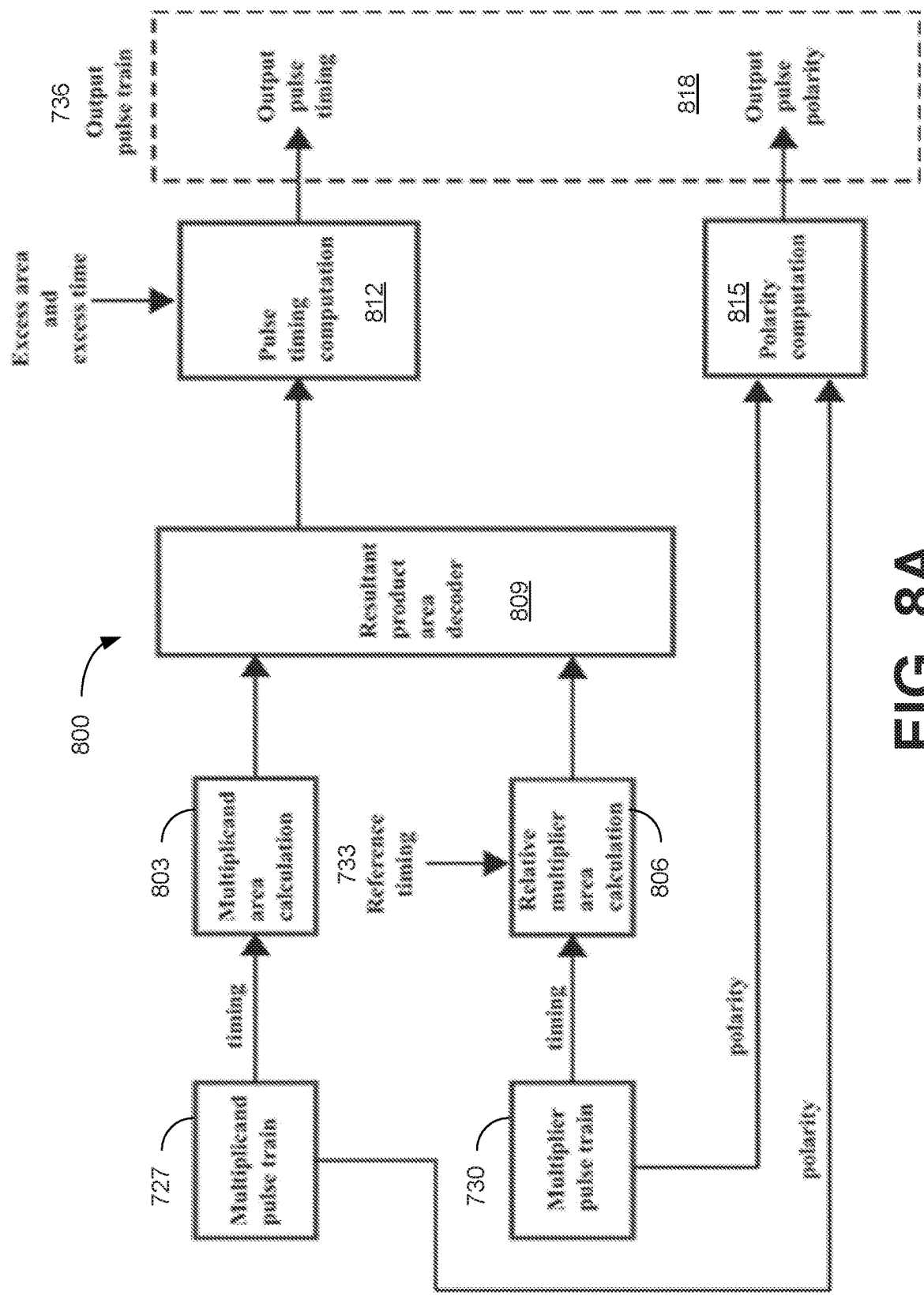
FIGS. 8A through 8C are schematic diagrams illustrating an example of a pulse domain multiplier architecture in accordance with various embodiments of the present disclosure.

Referring next to FIG. 8A, shown is a schematic representation of an example of a pulse domain multiplier architecture. The overall architecture of the pulse domain multiplier 800 is based on the steps involved in the pulse domain multiplication of excess areas as illustrated in FIG. 7C. The multiplicand area and the multiplier area can be calculated from the time difference between the pulses of the multiplicand and multiplier pulse trains 727 and 730, and the reference timing 733, by multiplicand area calculation circuitry 803 and relative multiplier area circuitry 806. The net constant area at a given time can be decoded from the multiplicand area and the relative multiplier areas by the RPA decoder 809. Then, the output pulse time can be computed from the net area by pulse timing computation circuitry 812, while accounting for the excess area as shown in FIG. 7C. The polarity of the pulses of the output pulse train 736 can be given by bitwise multiplication of the polarities of the multiplicand and multiplier pulse trains 727 and 730 by polarity computation circuitry 815. Pulse train circuitry 818 can then generate the output pulse train 736 based upon the output pulse timing and polarity.

Figure 8B:
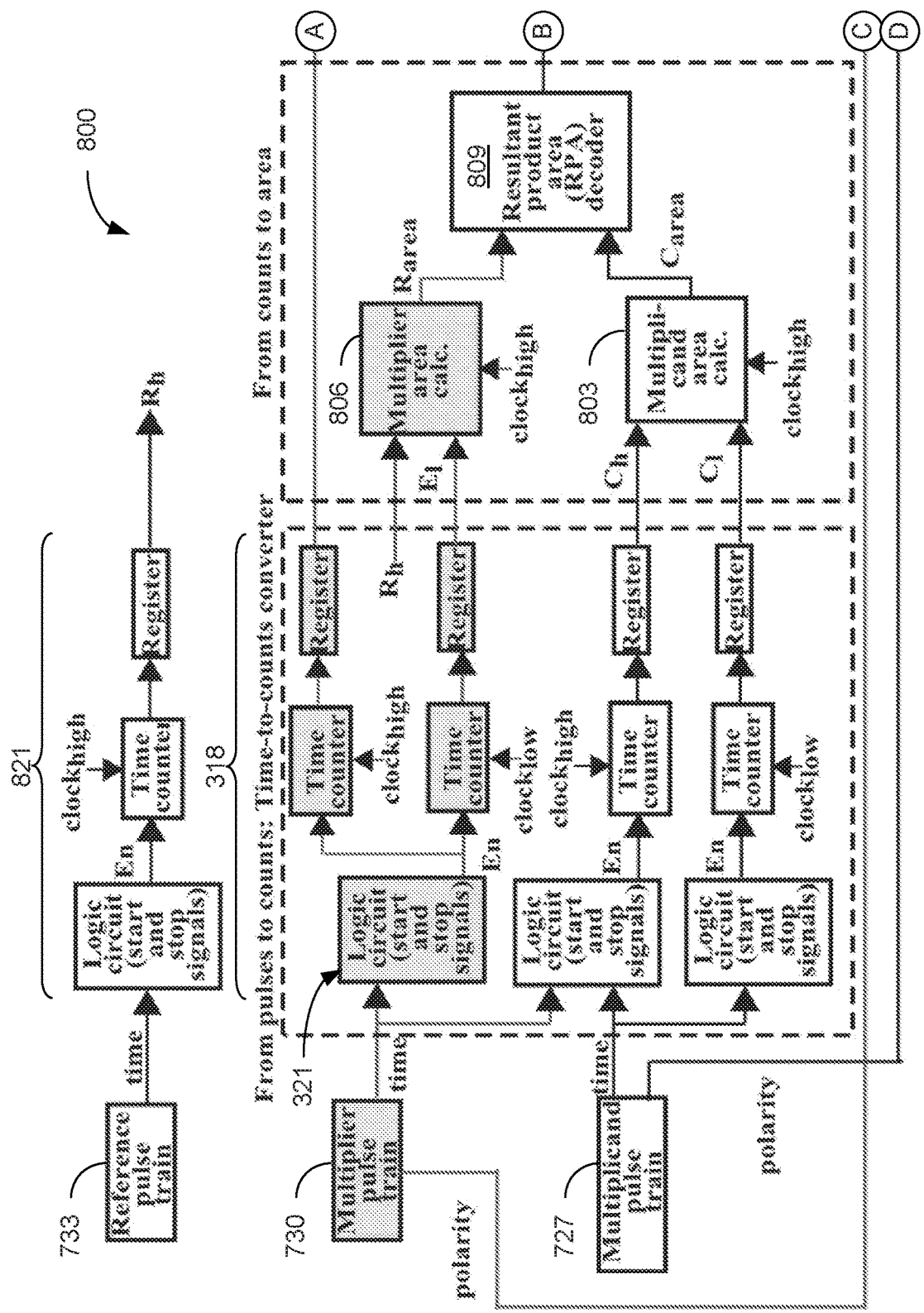
Figure 8C:
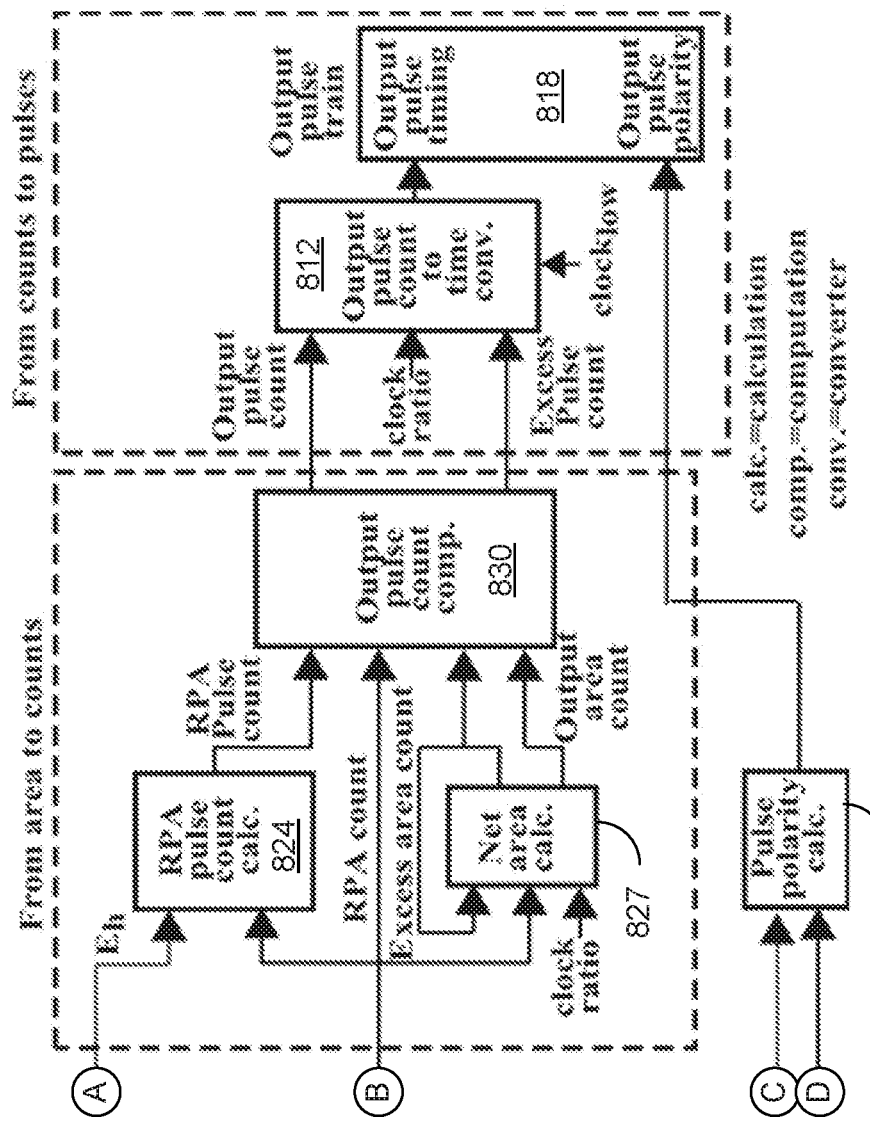

FIGS. 8B and 8C show one possible embodiment of a pulse domain multiplier 800 based upon the exemplary architecture of FIG. 8A. TCC 318 recognizes the IF pulse events of multiplicand and multiplier pulse trains 727 and 730. The TCC 318 provides a digital representation (counts) of the time between pulses as previously discussed with respect to FIG. 4A.

Figure 9:
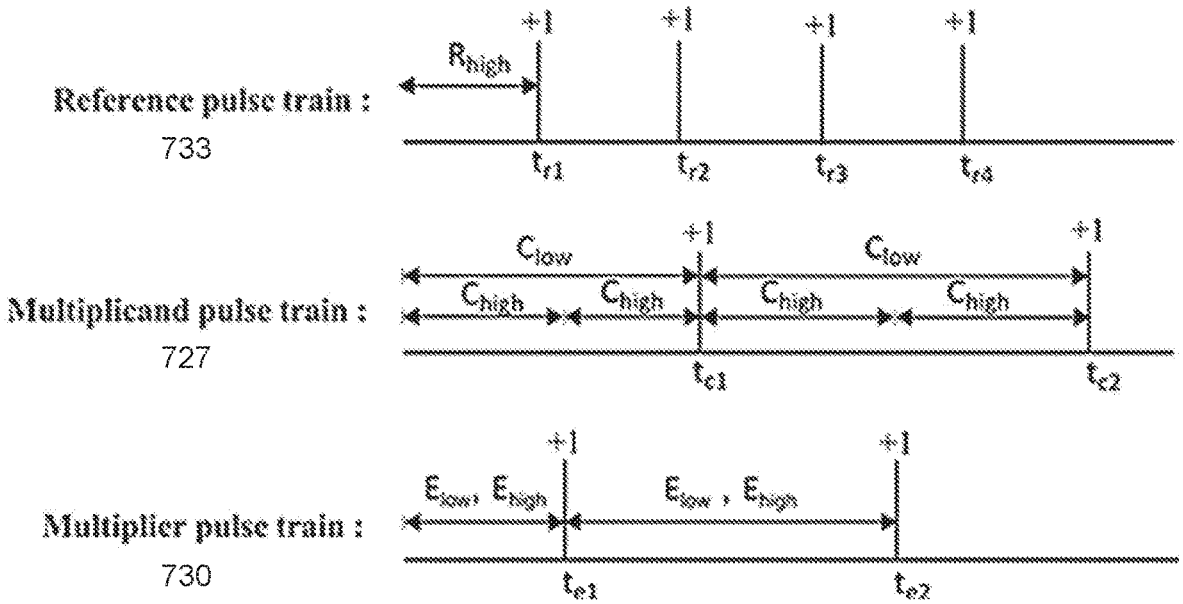
FIG. 9 illustrates an example of IF pulse timings for the pulse domain multiplier architecture in accordance with various embodiments of the present disclosure.

As shown in FIG. 8B, the TCC 318 operates on two different clock speeds on both the multiplicand and multiplier pulse trains 727 and 730. The start and stop logic circuitry 321 of the TCC 318 with higher clock speed (clock$_{high}$) are controlled by the IF pulses of both the multiplicand and multiplier pulse trains 727 and 730. On the other hand, the start and stop logic circuitry 321 of the TCC 318 with lower clock speed (clock$_{low}$) operates over the multiplicand and multiplier pulse trains 727 and 730 separately. The reference timing is computed with the higher clock speed using logic and control circuitry 821 illustrated in FIG. 8B. This is illustrated in FIG. 9, which shows an example of the TCC 318 high and low clock controls with respect to the multiplicand and multiplier pulse trains 727 and 730 and the reference pulse train 733.

The area corresponding to the counts of the TCC 318 can be computed using decrement counters as shown in FIG. 5A. The RPA can be computed by multiplying the two areas using the product counter in FIG. 5C. The rest of the process up to generation of output pulse timings has been presented with respect to FIG. 8A, which is similar to FIGS. 3B and 3C. Referring back to FIG. 8C, RPA pulse count calculation circuitry 824 can include a decrement counter that takes as input the RPA count and time duration count (obtained from multiplier counts from the higher clock). Its output, the RPA pulse count which is a ratio of time duration and RPA count, represents the count of the timing due to the current RPA. In the net area calculation circuitry 827, the net area is given by the sum of the RPA and excess area which is done in a sum counter. Output pulse count computation circuitry 830 can obtain the output pulse count and excess pulse count by multiplying the output area count by the RPA pulse count and by multiplying the excess area count by the RPA pulse count, respectively. The output pulse polarity is given by bitwise multiplication of the multiplicand and multiplier pulse polarity using pulse polarity calculation circuitry 815. Like addition, the precision of pulse domain multiplication is controlled by the ratio of the two clocks (high and low).

Figure 10A:
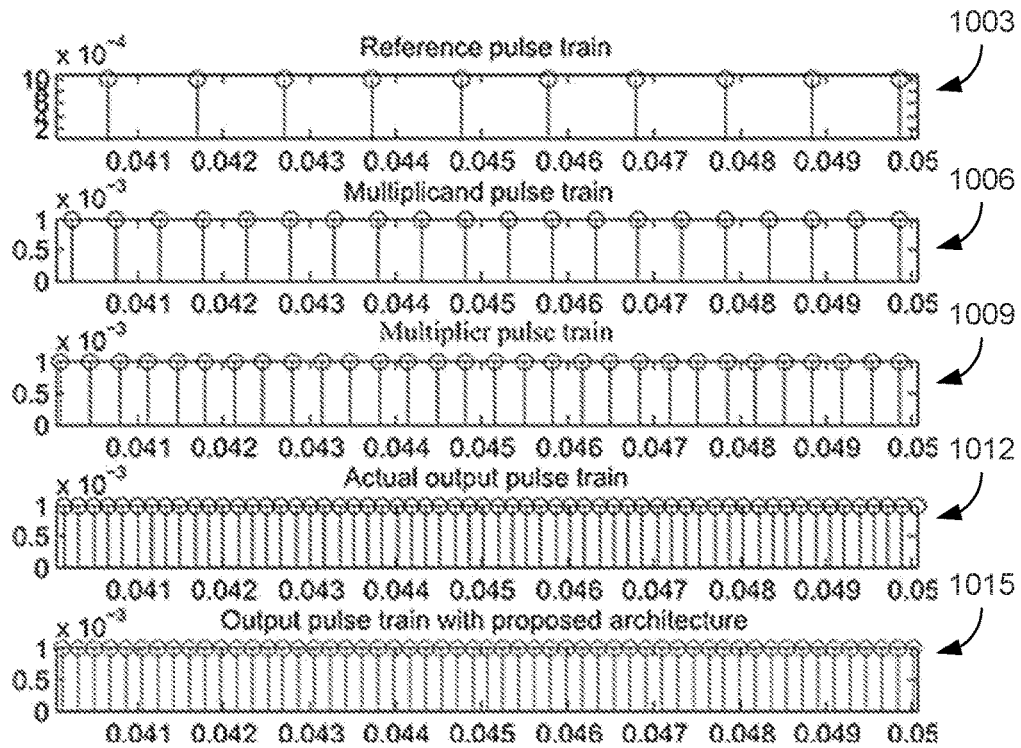
FIGS. 10A through 10D illustrate pulse trains and corresponding reconstructed signals of the pulse domain multiplier architecture in accordance with various embodiments of the present disclosure.
Figure 10B:
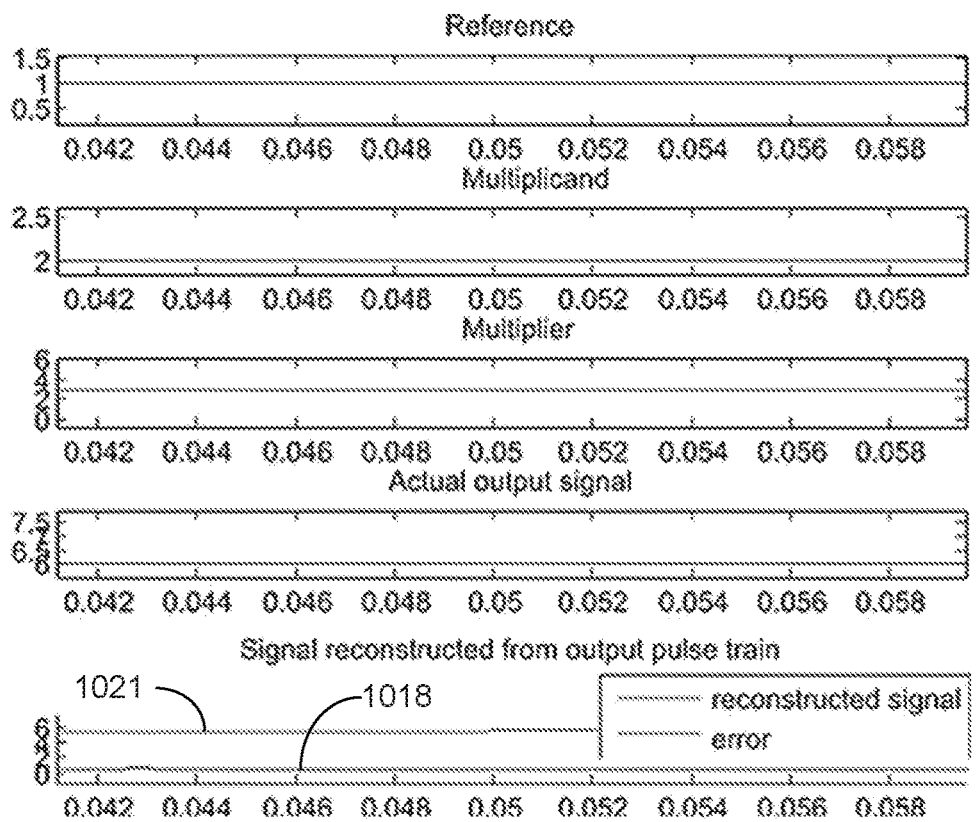
Figure 10C:
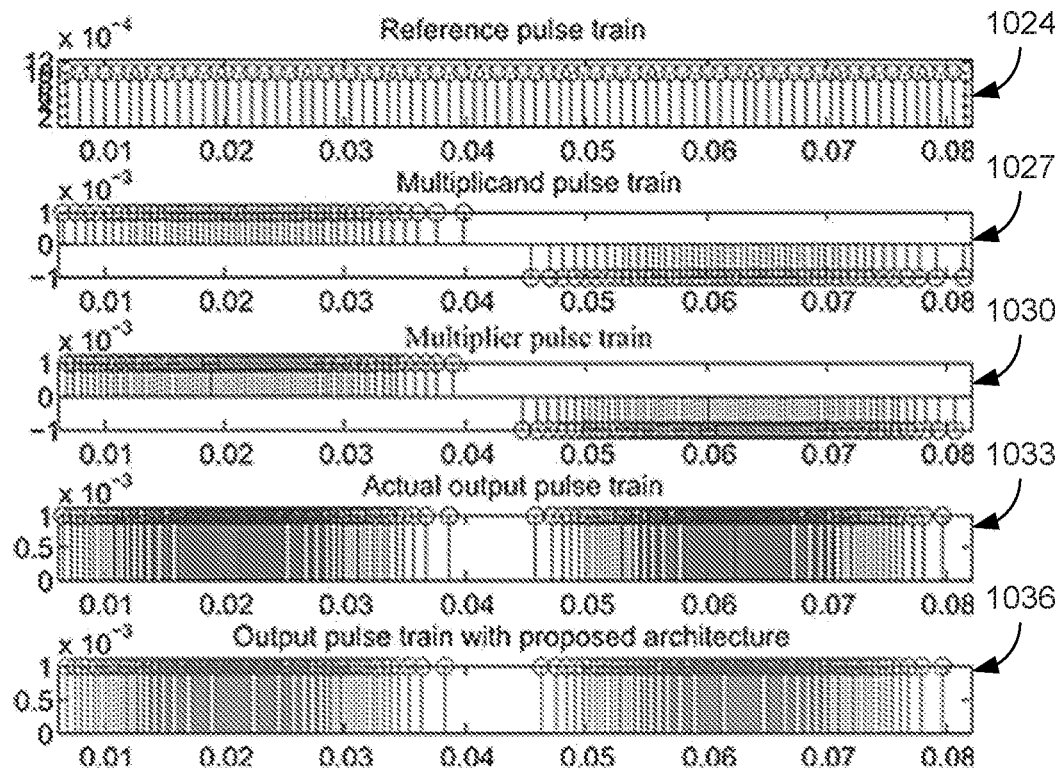
Figure 10D:
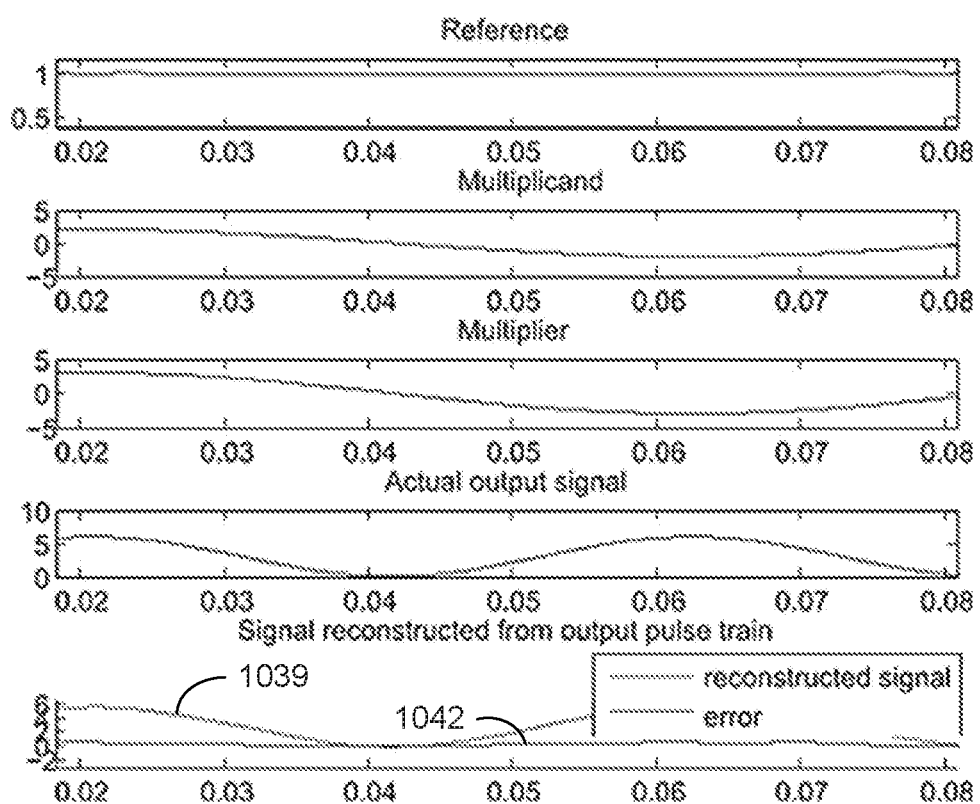

Simulations based on the pulse domain multiplier architecture were done with the following clock speeds: clock$_{high}$=100 MHz, clock$_{low}$=1 MHz. In FIG. 10A, the multiplication of two periodic pulse trains is illustrated. The reference pulse train 1003, multiplicand pulse train 1006, and multiplier pulse train 1009 include series of positive pulses. FIG. 10A shows the actual output pulse train 1012 and the output pulse train 1015 of the pulse domain multiplier architecture. The reconstructed signals are shown in FIG. 10B, including the reconstructed signal 1018 from the pulse domain multiplier architecture and the error 1021 of the reconstructed signal 1018. In FIG. 10C, the pulse domain multiplication of two non-periodic pulse trains is illustrated. The reference pulse train 1024 includes a series of positive pulses and the multiplicand and multiplier pulse trains 1027 and 1030 include non-periodic series of positive and negative pulses. FIG. 10C shows the actual output pulse train 1033 and the output pulse train 1036 of the pulse domain multiplier architecture. The reconstructed signals are shown in FIG. 10D, including the reconstructed signal 1039 from the pulse domain multiplier architecture and the error 1042 of the reconstructed signal 1039.

Thus, the sequence of steps in pulse train multiplication process is as follows:

a) Calculate resultant area:

$$N = p_u \left[ \frac{r_{n+1} - r_n}{u_{n+1} - u_n} \right] p_d \left[ \frac{b-a}{d_{n+1} - d_n} \right]$$

b) Case 1: N≠0 and |N+$N_{ex}$|≥1, where $N_{ex}$ is the excess area and ($e_{n+1}-e_n$) is excess area time.
  i. Resultant area time:

$$p_{n+1} - p_n = \left| \frac{(u_{n+1} - u_n) \cdot (d_{n+1} - d_n)}{(r_{n+1} - r_n)} \right|$$

ii. Pulse output time: $O_i - O_{i-} = (e_{n+1}-e_n)+(p_{n+1}-p_n)(1-|N_{ex}|)$.
  iii. Update: N→N−(1−$N_{ex}$); $N_{ex}$=N; ($e_{n+1}-e_n$)=b−$O_i$
c) Case 2: N≠0 and |N+$N_{ex}$|<1
  Update: $N_{ex}$→$N_{ex}$+N; ($e_{n+1}-e_n$)=b−$O_i$
d) Case 3: N=0
  Update: $N_{ex}$→$N_{ex}$; ($e_{n+1}-e_n$)=b−$O_i$ It is to noted that if no constraint is on α, then, instead of equation (8), calculation of the resultant product of the area contribution involves solving the equation:

$$\frac{\int_a^b x(t)e^{-\alpha(u_{n+1}-t)}dt}{\int_a^b e^{-\alpha(r_{n+1}-t)}dt} \cdot \int_a^b y(t)e^{-\alpha(d_{n+1}-t)}dt = \quad (11)$$

$$M \int_{p_n}^{p_{n+1}} \{x(t) \cdot y(t)\}e^{-\alpha(p_{n+1}-t)}dt$$

Solving equation (11) yields:

$$p_{n+1} - p_n = \frac{-1}{\alpha} \ln\left(1 - \left| \frac{g(u_{n+1} - u_n) \cdot g(d_{n+1} - d_n)}{g(r_{n+1} - r_n)} \right| \right) \quad (12)$$

where $p_u$ and $p_d$ are the polarities of the multiplicand and multiplier pulse times, and $g(m)=1-e^{-\alpha(m)}$. Using equation (12), similar pulse multiplier structures and processes can be derived by including logarithm and exponential blocks in the architecture.

Integrated Addition and Multiplication

Sub-systems for both a pulse domain adder and a pulse domain multiplier are similar. Therefore, pulse domain adder and multiplier architectures of FIGS. 3A and 8A can be integrated as a single unit to perform pulse domain addition and multiplication simultaneously. For instance, much of the circuitry such as time counters, decrement counters, sum counters, product counters, logic circuitry, net area calculator, etc., in the implementation schemes of FIGS. 3B-3C and 8B-8C are the same. Hence, a single hybrid architecture can be implemented to perform both pulse domain addition and multiplication.

Pulse domain addition and multiplication has been presented, as well as architectures for the implementation of pulse domain adders and multipliers. Using the disclosed architectures, conventional signal processing techniques can be performed directly on the outputs of an IF sampler without the need for power-hungry reconstruction and digitization processes. The disclosed general purpose computation in pulse trains may lead to low power wearable sensing architectures with low complexity and data rates.

Embodiments of the present disclosure are related to pulsed based arithmetic. In one or more aspects, the methodology utilizes pairs of adjacent pulses in pulse trains produced by two independent IFCs, which correspond to areas under the curves of corresponding analog signals, to estimate the addition or multiplication of the instantaneous amplitudes of the pair of analog signals fed to the IFCs. The domain of application of the methodology is the class of analog signals that belong to the class of finite bandwidth signals. The methodology also applies to IFCs that have no leakage, and potentially other modifications that preserve a one-to-one mapping with a unique inverse function (or constraint function) between the analog signals and the pulse trains.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims. In addition, all optional and preferred features and modifications of the described embodiments and dependent claims are usable in all aspects of the disclosure taught herein. Furthermore, the individual features of the dependent claims, as well as all optional and preferred features and modifications of the described embodiments are combinable and interchangeable with one another.

Therefore, at least the following is claimed:

1. A pulse domain device, comprising:
   an augend area calculator configured to provide an augend area output corresponding to an area of an augend pulse train input;
   an addend area calculator configured to provide an addend area output corresponding to an area of an addend pulse train input;
   a resultant sum area (RSA) decoder configured to provide a RSA output based upon the augend area output and the addend area output; and
   a pulse timing calculator configured to provide RSA output pulse timing corresponding to the RSA output.

2. The pulse domain device of claim 1, comprising a time-to-counts converter (TCC) configured to convert IF pulse timing of the augend pulse train input and the addend pulse train input into corresponding digital counts provided to the augend area calculator and the addend area calculator.

3. The pulse domain device of claim 2, wherein the corresponding digital counts comprise a high speed digital count and a low speed digital count.

4. The pulse domain device of claim 3, wherein the high speed digital count is based upon IF pulses of both the augend pulse train input and the addend pulse train input.

5. The pulse domain device of claim 3, wherein the low speed digital count is based upon IF pulses of either the augend pulse train input or the addend pulse train input.

6. The pulse domain device of claim 1, comprising output pulse train circuitry configured to generate an output pulse train based upon the RSA output and the RSA output pulse timing.

7. A pulse domain device, comprising:
   a multiplicand area calculator configured to provide a multiplicand area output corresponding to an area of a multiplicand pulse train input;
   a multiplier area calculator configured to provide a multiplier area output corresponding to an area of a multiplier pulse train input;
   a resultant product area (RPA) decoder configured to provide a RPA output based upon the multiplicand area output and the multiplier area output; and
   a pulse timing calculator configured to provide RPA output pulse timing corresponding to the RPA output.

8. The pulse domain device of claim 7, comprising a time-to-counts converter (TCC) configured to convert IF pulse timing of the multiplicand pulse train input and the multiplier pulse train input into corresponding digital counts provided to the multiplicand area calculator and the multiplier area calculator.

9. The pulse domain device of claim 8, wherein the corresponding digital counts comprise a high speed digital count and a low speed digital count.

10. The pulse domain device of claim 9, wherein the high speed digital count is based upon IF pulses of both the multiplicand pulse train input and the multiplier pulse train input.

11. The pulse domain device of claim 9, wherein the low speed digital count is based upon IF pulses of either the multiplicand pulse train input or the multiplier pulse train input.

12. The pulse domain device of claim 7, comprising output pulse train circuitry configured to generate an output pulse train based upon the RPA output and the RPA output pulse timing.

13. The pulse domain device of claim 12, comprising a pulse polarity calculator configured to provide an output pulse polarity output based upon pulse polarities of the multiplicand pulse train input and the multiplier pulse train input.

14. A method, comprising:
    receiving a first pulse train corresponding to a first analog signal by a predefined constraint function and a second pulse train corresponding to a second analog signal by the predefined constraint function; and
    generating an output pulse train through a pulse domain operation on the first and second pulse trains.

15. The method of claim 14, wherein the first pulse train is an augend pulse train, the second pulse train is an addend pulse train, and the pulse domain operation is pulse domain addition of the augend and addend pulse trains.

16. The method of claim 15, wherein the pulse domain addition comprises:
    determining output pulses from a resultant sum area (RSA) based upon the augend and addend pulse trains; and
    determining corresponding output pulse times based at least in part upon RSA timing.

17. The method of claim 14, wherein the first pulse train is a multiplicand pulse train, the second pulse train is a multiplier pulse train, and the pulse domain operation is pulse domain multiplication of the multiplicand and multiplier pulse trains.

18. The method of claim 17, wherein the pulse domain multiplication comprises:
    determining output pulses from a resultant product area (RPA) based at least in part upon the augend and addend pulse trains; and
    determining corresponding output pulse times based at least in part upon RPA timing.

19. The method of claim 18, wherein the RPA is further based upon a reference timing pulse train.

20. The method of claim 14, comprising reconstructing an analog output signal from the output pulse train.

21. The method of claim 14, wherein the first pulse train corresponds to an area under the first analog signal and the second pulse train corresponds to area under the second analog signal.

22. The method of claim 14, wherein the first and second pulse trains are generated by independent integrate and fire analog-to-pulse converters (IFCs).

23. The method of claim 14, wherein the first and second analog signals are finite bandwidth signals.

24. The method of claim 14, wherein the constraint function preserves a one-to-one mapping with a unique inverse function.

* * * * *